(12) United States Patent
Hu et al.

(10) Patent No.: US 8,501,580 B2
(45) Date of Patent: Aug. 6, 2013

(54) PROCESS OF FABRICATING SEMICONDUCTOR DEVICE WITH LOW CAPACITANCE FOR HIGH-FREQUENCY CIRCUIT PROTECTION

(76) Inventors: Jerry Hu, Taipei (TW); Panchien Lin, Hsinchu (TW); Bert Huang, Hsinchu (TW)

( * ) Notice: Subject to any disclaimer, the term of this patent is extended or adjusted under 35 U.S.C. 154(b) by 0 days.

(21) Appl. No.: 13/036,582

(22) Filed: Feb. 28, 2011

(65) Prior Publication Data

US 2011/0212595 A1    Sep. 1, 2011

Related U.S. Application Data

(60) Provisional application No. 61/308,548, filed on Feb. 26, 2010.

(51) Int. Cl.
| | |
|---|---|
| H01L 21/76 | (2006.01) |
| H01L 21/30 | (2006.01) |
| H01L 21/425 | (2006.01) |
| H01L 21/302 | (2006.01) |

(52) U.S. Cl.
USPC ............ 438/424; 438/455; 438/514; 438/690

(58) Field of Classification Search
None
See application file for complete search history.

(56) References Cited

U.S. PATENT DOCUMENTS

| | | | |
|---|---|---|---|
| 5,311,042 A | 5/1994 | Anceau | |
| 6,153,495 A * | 11/2000 | Kub et al. | 438/459 |
| 6,194,290 B1 * | 2/2001 | Kub et al. | 438/455 |
| 6,274,892 B1 * | 8/2001 | Kub et al. | 257/131 |
| 6,867,436 B1 | 3/2005 | Matteson et al. | |

* cited by examiner

Primary Examiner — Scott B Geyer
(74) Attorney, Agent, or Firm — Arent Fox LLP

(57) ABSTRACT

A process for fabricating a semiconductor device includes depositing n-type dopant on a p-type substrate, implanting n-type material into the substrate, and growing an n-type epitaxial layer atop the n+ layer. Trenches surrounding the device region are formed and an n+ layer on the sidewalls of the trenches is formed. The trenches are filled by growing a layer of thermal oxide on the sidewalls of the trenches and deposition of plasma enhanced oxide or polysilicon into the trenches, and planarizing the top surface. n+ region of the device is formed by forming an oxide layer on the top surface of the device layer and etching the oxide, depositing n-type dopant material and driving in by high temperature diffusion. p+ region of the device is formed by etching the oxide, depositing p-type dopant material and driving in by high temperature diffusion so that the breakdown voltage is set for circuit protection.

18 Claims, 19 Drawing Sheets

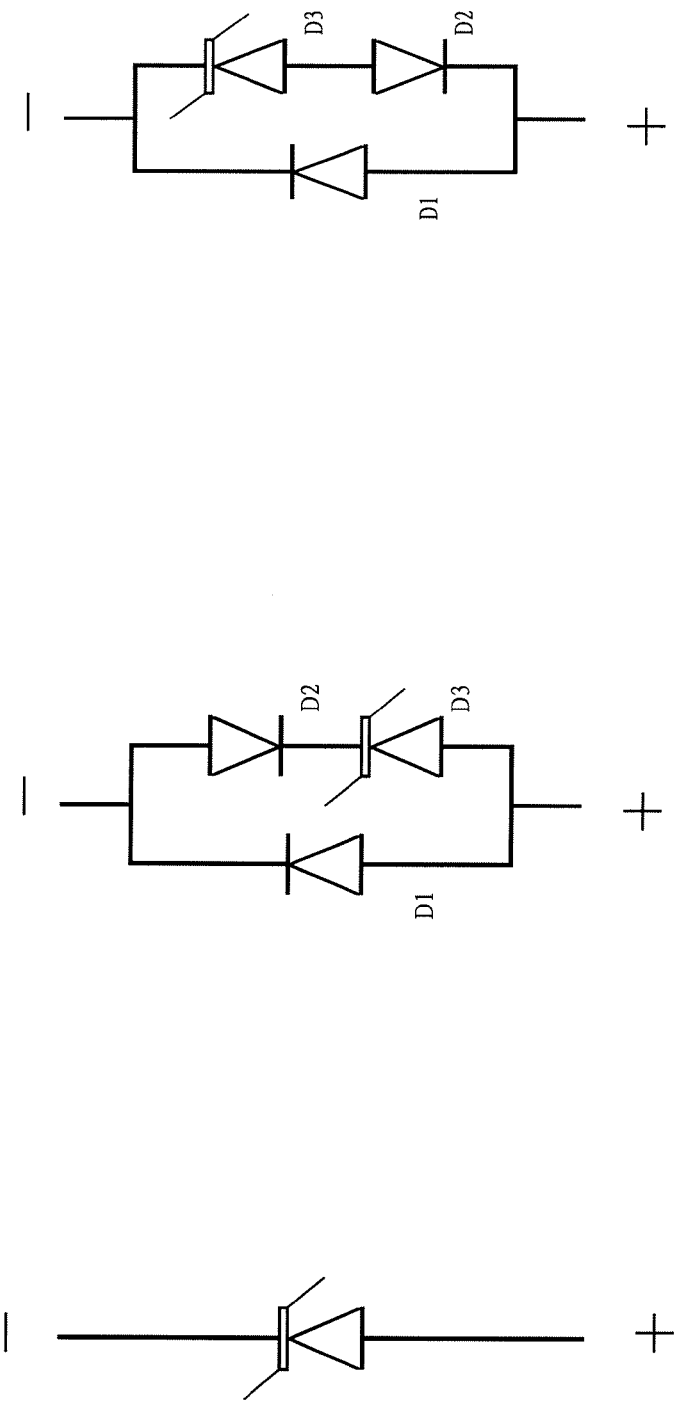

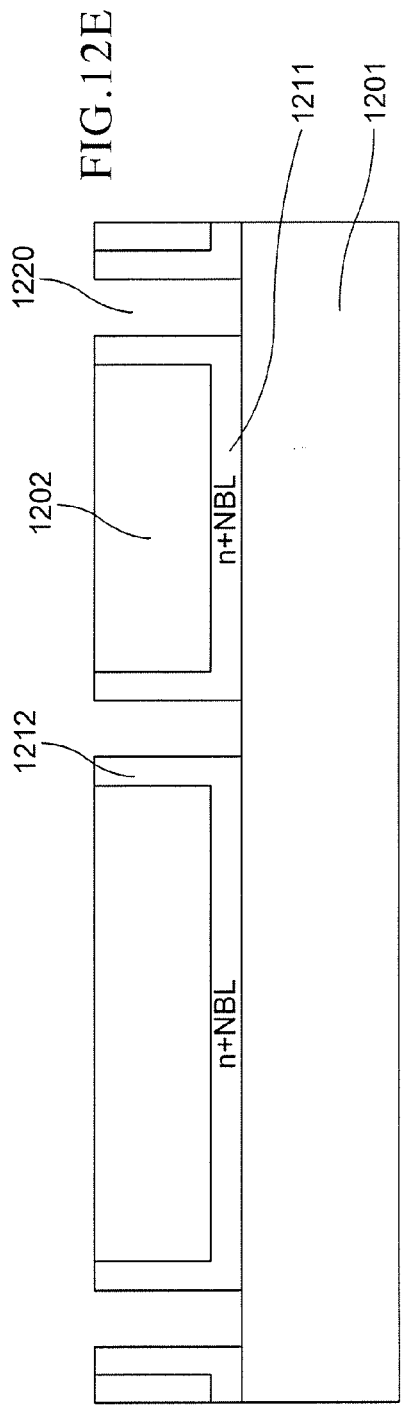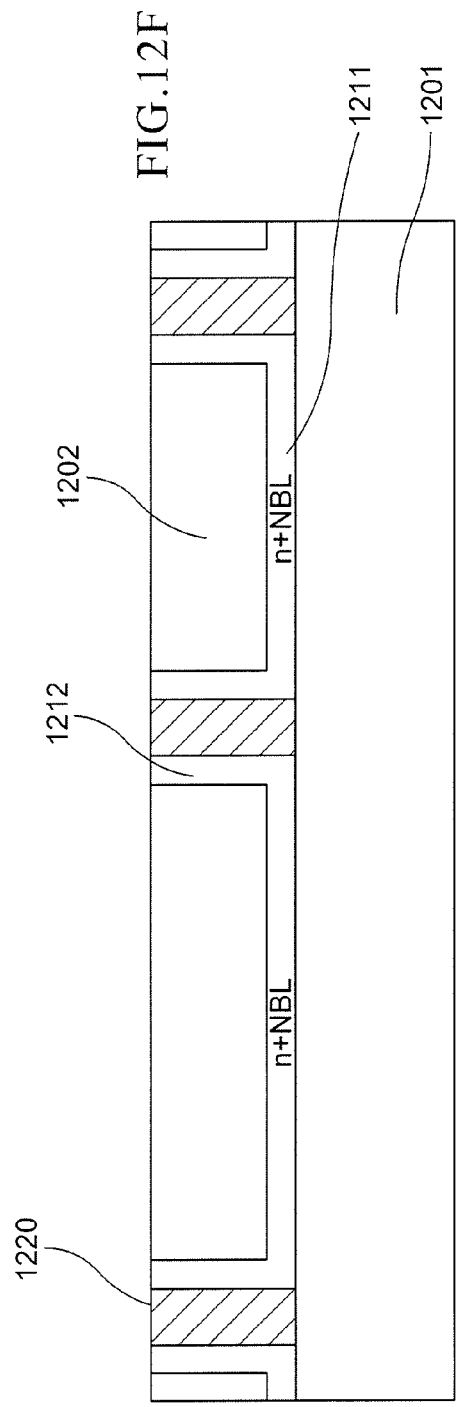

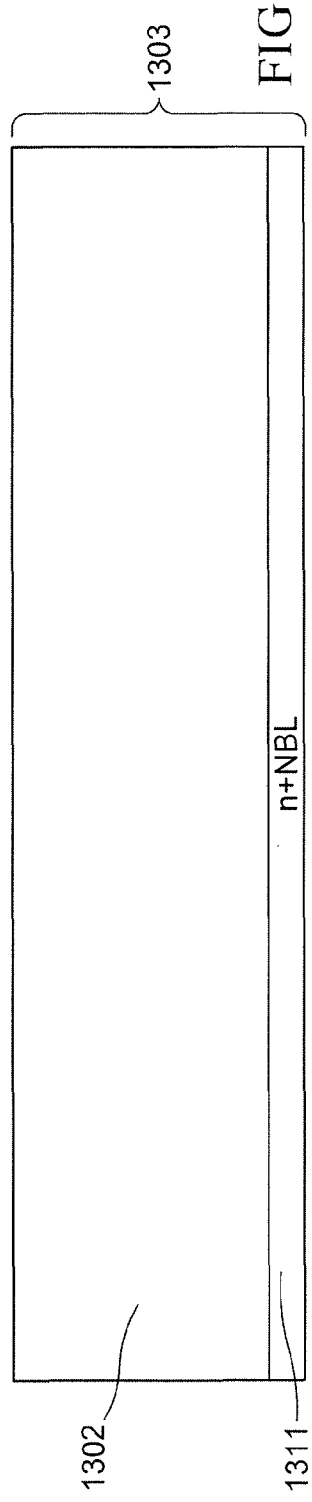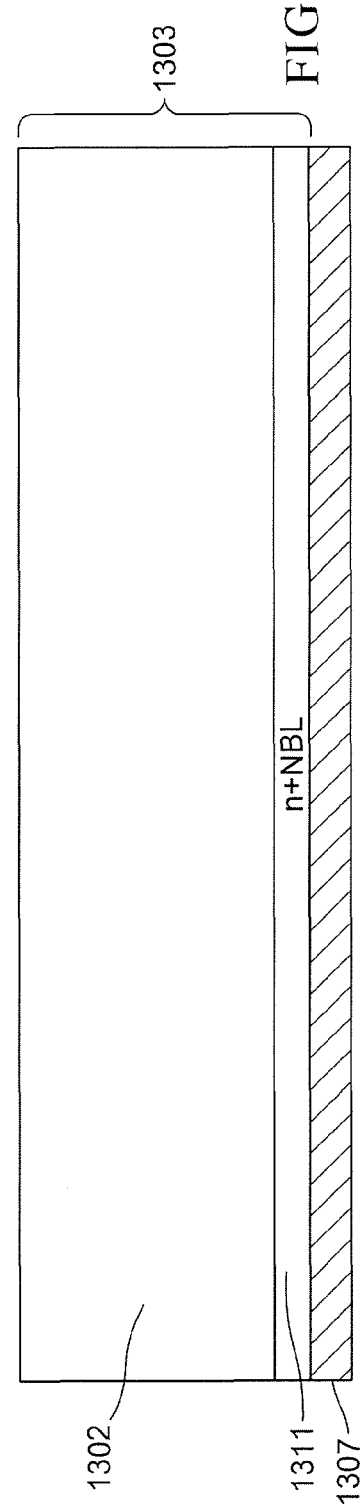

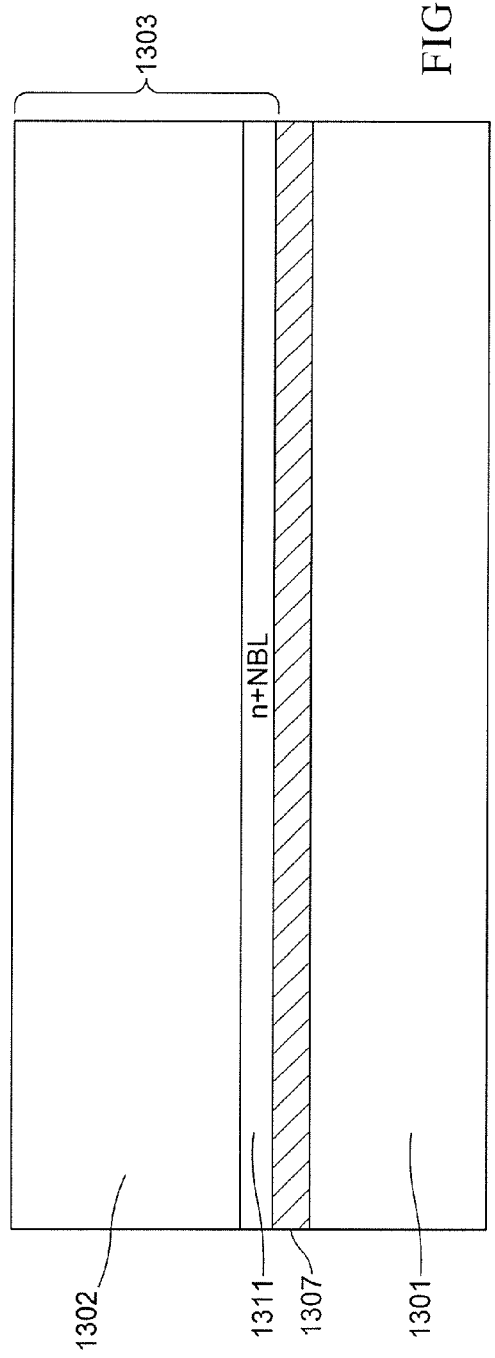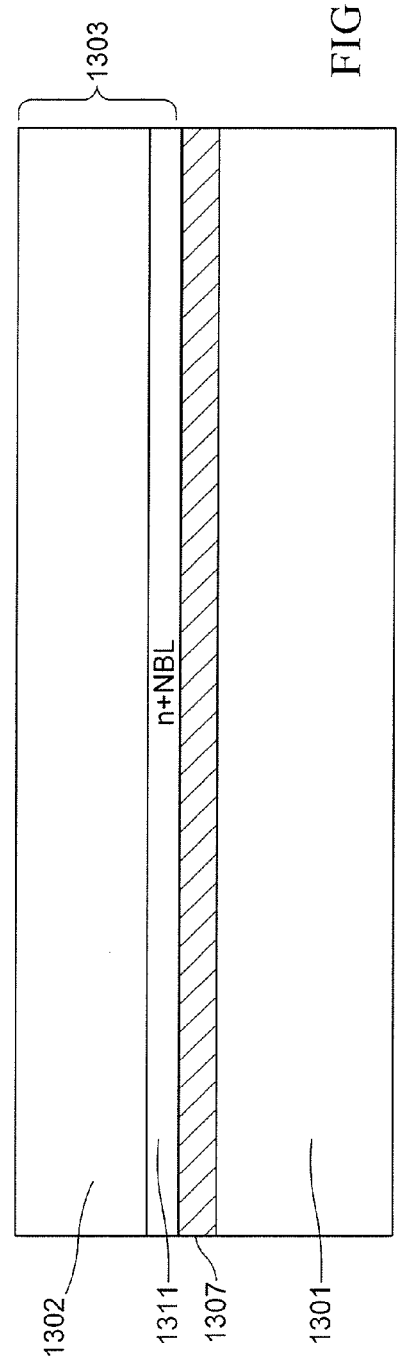

PROCESS OF FABRICATING SEMICONDUCTOR DEVICE WITH LOW CAPACITANCE FOR HIGH-FREQUENCY CIRCUIT PROTECTION

BACKGROUND OF THE INVENTION

1. Field of the Invention

The present invention relates in general to semiconductor devices and more particularly to semiconductor devices having reduced capacitance for protecting high frequency circuit applications from electrostatic discharge surge energy and transient electrical overstress.

2. Description of Related Art

In order to protect vulnerable circuits from electrical overstress such as that caused by electrostatic discharge, inductive load switching and lightning, a semiconductor device is usually employed to clamp the transient voltage to a nondestructive level. The semiconductor device for such transient voltage suppression purpose can be a diode, a transistor, a thyristor, an assembled device or a circuit.

Conventionally, a unidirectional protection device for such application is a Zener or avalanche diode constructed out of a semiconductor p-n junction (FIG. 1A). Based on semiconductor physics, the depletion-layer capacitance that arises inevitably across the one-sided abrupt junction for a p-n junction diode is $$C_d = \epsilon_{Si} A / W_D = (q \epsilon_{Si} N_D (V_R + V_{bi})/2)^{1/2} A \tag{1}$$

where $\epsilon_{Si}$ is the permittivity of silicon, q is the electric charge, $N_D$ is the doping concentration of the lightly doped region of the junction, $V_R$ is the reverse bias voltage across the diode, $V_{bi}$ is the built-in potential, $W_D$ is the depletion-layer width of the junction and A is the junction area.

This capacitance is proportional to the square root of the doping concentration on the lightly doped side of the p-n junction. It is also proportional to the size of the overall junction area of the device. In a diode with breakdown voltage range of 5 to 20 volts, doping concentration on the lightly doped side ranges approximately from 1E17 to 5E18 atoms/cm$^3$. The corresponding capacitance of the junction, assuming active p-n junction area of 0.1 mm$^2$, is approximately 100 to 700 pF, which is relatively too high a value for high frequency applications.

To use such diodes in high frequency circuits it is generally necessary to reduce their capacitance to low pico- or even sub pico-Farad range. One simple approach is to combine the conventional unidirectional diode device with low capacitance switching diodes or p-i-n diodes in various circuit configurations. FIGS. 1B and 1C show an assembly of diodes having the same function as the conventional unidirectional diode device of FIG. 1A. This assembled device comprises of a conventional diode D3 and two p-i-n diodes, diode D2 used as a capacitance cancellation diode and diode D1 used as a current bypassing diode.

When the cathode of the assembled device is applied with a positive voltage relative to the anode, diode D3 is reverse biased, diode D2 is forward biased and diode D1 is reverse biased. The cathode current flows through the assembled device only when the cathode bias voltage is higher than the breakdown voltage of diode D3 plus the forward voltage drop of diode D2. When the cathode of the assembled device is applied with a negative voltage relative to the anode, diode D2 is reverse biased and blocks current flow through the forward biased diode D3. The cathode current flows completely through diode D1 which is under forward bias condition. Thus, diode D1 provides the current bypassing operation under forward bias, and let the entire assembled device act completely the same function as the conventional unidirectional diode device of FIG. 1A.

In the assembled device, the diode D3 is in series with the capacitance cancellation diode D2, resulting in a combined capacitance of $C_{D3} * C_{D2}/(C_{D3}+C_{D2}) \cong C_{D2}$, because $C_{D3}$ is typically much larger than $C_{D2}$ and can be neglected from the above relationship, and thus has no effect to the total capacitance of the combined diodes D3 and D2 structure. The entire assembled device is constructed by parallel arrangement of diode D1 with diodes D3/D2 combined structure, then, has a capacitance of $C_{Device} \cong C_{D1}+C_{D2}$, which is substantially less than the capacitance $C_{D3}$ of the conventional unidirectional diode device in FIG. 1A.

A conventional bidirectional diode device comprises two conventional unidirectional diode devices, connected in series and in a back-to-back configuration as shown in FIG. 2A. To reduce the capacitance of such a bidirectional diode device, FIGS. 2B and 2C show an assembled device comprising two pairs of diodes in an anti-parallel configuration. Each pair of diodes includes a conventional unidirectional diode D3 and a low capacitance switching diode or p-i-n diode D2, connected in a back-to-back configuration. When electrode 1 is positively biased relative to electrode 2, current flows through diodes D3_2 and D2_2. When electrode 2 is positively biased relative to electrode 1, current flows through diodes D3_1 and D2_1. The assembled device has a capacitance of $C_{Device} \approx 2C_{D2}$, which is substantially less than the capacitance of the conventional bidirectional diode device in FIG. 2A.

In FIG. 2D, another assembled device, which functions similarly to a conventional bidirectional diode device of FIG. 2A, comprises a diode bridge including a conventional unidirectional diode device and four switching diodes or p-i-n diodes. When electrode 1 is positively biased relative to electrode 2, current flows through diodes D2_1, D3, and D1_1. When electrode 2 is positively biased relative to electrode 1, current flows through diodes D2_2, D3 and D1_2. The diode D3 is under reverse-biased breakdown in either case. The assembled device has a capacitance of $C_{Device} \cong C_{D2}$, which is substantially less than the capacitance of the conventional bidirectional diode device in FIG. 2A.

For example, a semiconductor device disclosed in U.S. Pat. No. 5,311,042, describes two monolithic integrated semiconductor structures. One structure includes an assembly of diodes in a configuration the same as in FIG. 1B, having function of a unidirectional assembled device, and another structure includes an assembly of diodes in a configuration the same as in FIG. 2D, having function of a bidirectional assembled device. According to this prior art, the diffusion technology is employed to fabricate the lightly doped side of D2 and the epitaxial technology to D1. By using a doping concentration of approximately 1E15 atoms/cm$^3$ in the epitaxial layer and 1E16 atoms/cm$^3$ at the interface of p-n junction in the diffusion region, the structure can be made with low capacitance.

For another example, a semiconductor device disclosed in U.S. Pat. No. 6,867,436, describes a bidirectional assembled device has a configuration the same as in FIG. 2B. Two pairs of diodes in an anti-parallel arrangement are made in different islands in the epitaxial layer grown on a silicon substrate, and separated by p+ isolation diffusion region in order to avoid interference between the two pair of diodes. In this prior art, diodes D2 have the lightly doped side of the diode made in the epitaxial layer. When the resistivity of the epitaxial layer of 70 ohm-cm, or doping concentration of approximately $6E13/cm^3$, is adopted, the entire device with low capacitance of less than 10 pF can be made.

Drawback 1:

In the prior art described in U.S. Pat. No. 5,311,042, the lightly doped side of the diode D2 is an n-type diffusion region. Doping concentration of a diffusion region is usually in the range of $5E15-1E18/cm^3$. The doping concentration in the lightly doped side of the diode D1, which usually is formed by epitaxial growth, can be in the range of $2E13-1E15/cm^3$. Then the value of $C_{D2}$ is about 3 to 100 times that of $C_{D1}$. The capacitance of the entire unidirectional assembled device is $C_{Device} \cong C_{D1}+C_{D2}$, thus, $C_{D2}$ dominates the total capacitance $C_{Device}$ of the device.

Drawback 2:

In the prior art described in U.S. Pat. No. 6,867,436, it is inherently difficult to construct the device that achieves a device capacitance sufficiently low for any practical utilization in higher frequency circuit. This is because its structure needs a high-resistivity $n^-$ epitaxial layer with sufficient thickness to allow for full depletion inevitable for its physical operation in low capacitance range. Yet the long duration high temperature fabrication procedure in the p+ isolation diffusion incurs the spread out of the diffusion junction area that substantially reduces the thickness of its $n^-$ epitaxial layer. In fact, the effective thickness of the $n^-$ layer may be even reduced significantly due to the backward out-diffusion from the n+ buried layer and the n+ substrate in case it is used. This translates unfavorably into increased device capacitance. In order to compensate this effect, thicker epitaxial layer is adopted, and this will iteratively require longer diffusion for isolation region.

Drawback 3:

Typical isolation diffusion and deep n+ diffusion implemented for the fabrication of a conventional diode structure significantly consume the chip active area due to their long duration and high temperature procedure which results in the inevitable lateral diffusion.

SUMMARY OF THE INVENTION

It is an object of the present invention to find approaches to reduce the doping concentrations of the lightly doped region in both diodes, D1 and D2, inside the composite diode structure.

It is also an object of the present invention to reduce thermal cycles after the thickness of N-layer of the device is defined.

It is also an object of the present invention to minimize the width and the area of isolation region as well as the chip size using trench isolation.

The present invention achieves the above and other objects by providing a process for fabricating a semiconductor device having reduced capacitance for high frequency circuit protection that comprises:

forming an n+ buried layer in a p-type substrate by depositing n-type dopant on the top surface of the substrate and then drive in or by implanting n-type material into the substrate, and then growing an n-type epitaxial layer as the device layer atop the n+ buried layer;

forming trenches that surrounds the device region with depth extending from the top surface, going through the n+ buried layer and reaching down to the substrate and then forming an n+ layer on the sidewalls of the trenches by solid or gas phase deposition, or ion implantation;

filling the trenches by growing a layer of thermal oxide on the sidewalls of the trenches and followed by deposition of plasma enhanced oxide, nitride, TEOS oxide CVD oxide, or polysilicon into the trenches and then planarizing the top surface by plasma etch back or polishing;

forming n+ region of the device by forming an oxide layer on the top surface of the device layer and then etching the oxide by photolithography, then depositing n-type dopant material by solid or gas phase deposition or ion implantation and then driving in by high temperature diffusion;

forming p+ region of the device by etching the oxide using photolithography, then depositing p-type dopant material by solid or gas phase deposition or ion implantation and then driving in by high temperature diffusion so that the breakdown voltage between cathode and anode of the device is set to a targeted voltage for high frequency circuit protection.

The present invention also achieve the above and other objects by providing a process for fabricating a semiconductor device having reduced capacitance for high frequency circuit protection that comprises:

depositing n-type dopant material by solid or gas phase deposition, or implant n-type material using ion implantation to the polished side, top surface of a device wafer that serves as an n-type substrate;

forming an n+ buried layer by driving the n-type dopant material into the device wafer;

forming an intermediate layer by growing a thermal oxide layer and then depositing plasma-enhanced oxide, TEOS oxide, or polysilicon;

performing a direct wafer bonding procedure using a handling substrate of either p-type or n-type wafer by bonding the device wafer with the handling substrate and then annealing; then grinding and polishing from the back side of the device wafer up to a remaining device layer forming trenches that surrounds the device region with depth extending from the top surface, going through the n+ buried layer and reaching down to the intermediate layer and then forming an n+ layer on the sidewalls of the trenches by solid or gas phase deposition or ion implantation;

filling the trenches by growing a layer of thermal oxide on the sidewalls of the trenches and followed by deposition of plasma enhanced oxide, nitride, TEOS oxide CVD oxide, or polysilicon into the trenches and then planarizing the top surface by plasma etch back or polishing;

forming n+ region of the device by forming an oxide layer on the top surface of the device layer and then etching the oxide by photolithography, then depositing n-type dopant material by solid or gas phase deposition or ion implantation and then driving in by high temperature diffusion;

forming p+ region of the device by etching the oxide using photolithography, then depositing p-type dopant material by solid or gas phase deposition or ion implantation and then driving in by high temperature diffusion so that the breakdown voltage between cathode and anode of the device is set to a targeted voltage for high frequency circuit protection.

The present invention further achieves the above and other objects by providing another process for fabricating a semiconductor device having reduced capacitance for high frequency circuit protection that comprises:

forming an oxide on the surface of the device wafer of n-type doped substrate;

forming an n+ buried layer by driving the n-type dopant material into the polished side, top surface of device wafer and driving in by high temperature diffusion;

forming an intermediate layer by growing a thermal oxide layer or by growing a thin thermal oxide layer and then depositing plasma-enhanced oxide, TEOS oxide and/or polysilicon;

performing a direct wafer bonding procedure using a handling substrate of an p+ doped wafer by bonding the device wafer with the handling substrate and then annealing; then grinding and polishing from the back side of the device wafer up to a remaining device layer;

forming the first trenches that surround the device region with depth extending to the intermediate layer;

forming an n+ layer on the sidewalls of the trenches by solid or gas phase deposition or ion implantation;

filling the trenches by growing a layer of thermal oxide on the sidewalls of the trenches and followed by deposition of plasma enhanced oxide, nitride, TEOS oxide CVD oxide, or polysilicon into the trenches and then planarizing the top surface by plasma etch back or polishing;

growing an oxide layer and then forming the second trenches inside the device region with depth extending from the top surface down through the intermediate layer and to the handling substrate;

filling the trenches by depositing a p+ doped polysilicon into the trenches and then planarizing the top surface by plasma etch back or polishing;

forming n+ region of the device by forming an oxide layer on the top surface of the device layer and then etching the oxide by photolithography, then depositing n-type dopant material by solid or gas phase deposition or ion implantation and then driving in by high temperature diffusion;

forming p+ region of the device by etching the oxide using photolithography, then depositing p-type dopant material by solid or gas phase deposition or ion implantation and then driving in by high temperature diffusion so that the breakdown voltage between cathode and anode of the device is set to a targeted voltage for high frequency circuit protection.

The present invention further achieves the above and other objects by providing a process for fabricating a semiconductor device having reduced capacitance for high frequency circuit protection that comprises:

forming an oxide on the surface of the device wafer of n-type doped substrate;

forming trenches that surround the device region with depth extending from the top surface;

forming an n+ layer on the sidewalls of the trenches by solid or gas phase deposition or ion implantation;

filling the trenches by growing a layer of thermal oxide on the sidewalls of the trenches and followed by deposition of plasma enhanced oxide, nitride, TEOS oxide CVD oxide, or polysilicon into the trenches and then planarizing the top surface by plasma etch back or polishing;

forming an n+ buried layer by driving the n-type dopant material into the polished side, top surface of device wafer and driving in by high temperature diffusion;

forming the first intermediate layer by growing a thermal oxide layer or by growing a thin thermal oxide layer and then depositing plasma-enhanced oxide, TEOS oxide;

forming another intermediate layer by photolithography, etching oxide layer of the first intermediate layer, depositing an n+ doped polysilicon, and then planarizing the top surface by plasma etch back and/or polishing;

performing a direct wafer bonding procedure using a handling substrate of an n+ doped wafer by bonding the device wafer with the handling substrate and then annealing; then grinding and polishing from the back side of the device wafer up to a remaining device layer forming n+ region of the device by forming an oxide layer on the top surface of the device layer and then etching the oxide by photolithography, then depositing n-type dopant material by solid or gas phase deposition or ion implantation and then driving in by high temperature diffusion;

forming p+ region of the device by etching the oxide using photolithography, then depositing p-type dopant material by solid or gas phase deposition or ion implantation and then driving in by high temperature diffusion so that the breakdown voltage between cathode and anode of the device is set to a targeted voltage for high frequency circuit protection.

BRIEF DESCRIPTION OF THE DRAWINGS

FIG. 1A shows the symbol of a conventional unidirectional protection diode.

FIG. 1B shows the equivalent circuit of a unidirectional assembled device.

FIG. 1C shows the equivalent circuit of another unidirectional assembled device.

FIGS. 12A-12K are cross-sectional views for illustrating the device semiconductor construction at selected fabrication stages of the unidirectional assembled device of FIG. 4.

FIGS. 13A-13D are cross-sectional views for illustrating the device semiconductor construction at selected fabrication stages for preparing the device layer using wafer bonding technique of the assembled device of FIG. 14.

DETAILED DESCRIPTION OF THE PREFERRED EMBODIMENTS

Figure 4:
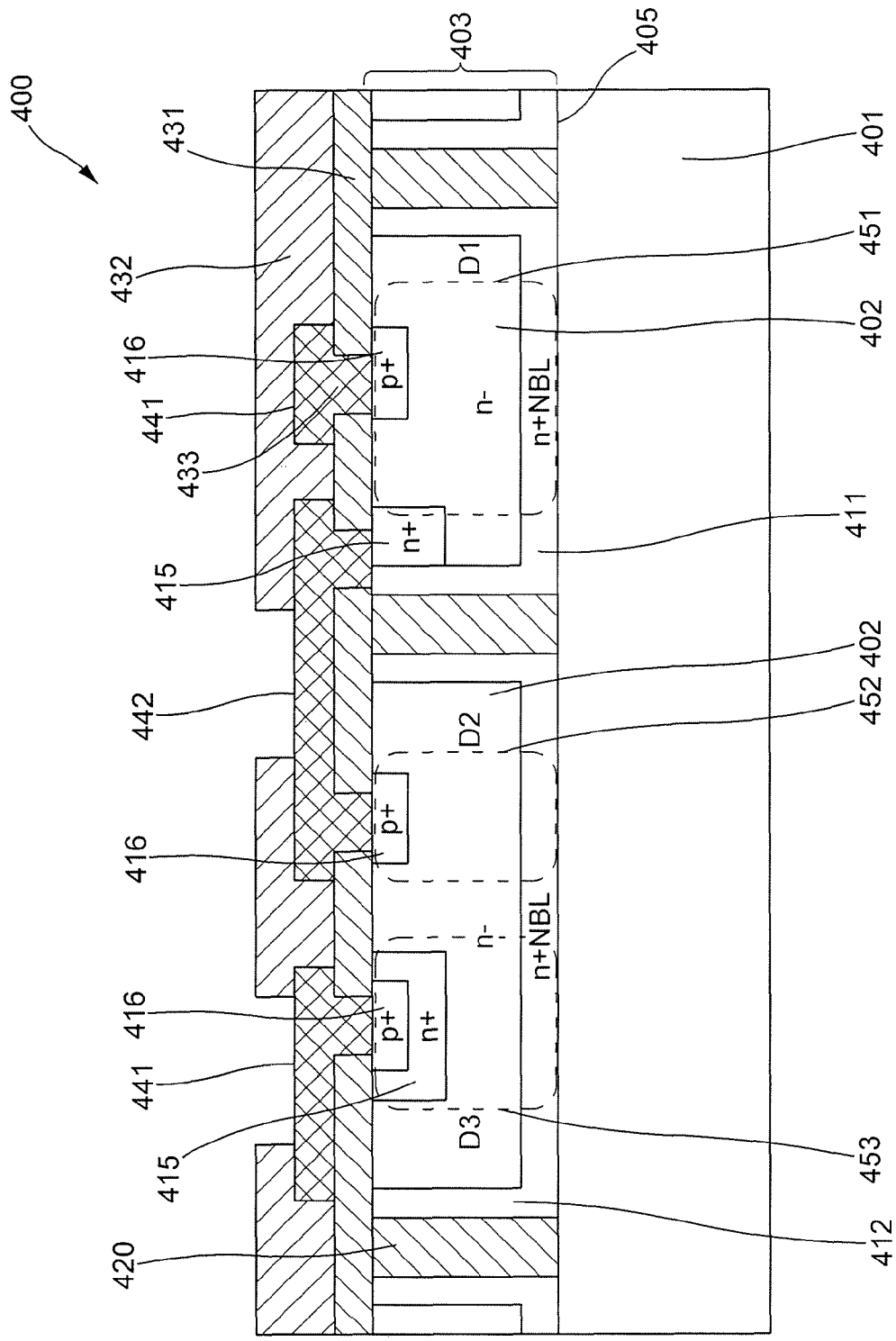
FIG. 4 is a cross-sectional view illustrating the semiconductor construction of a unidirectional assembled device, with equivalent circuit the same as that shown in FIG. 1B, fabricated in accordance with a preferred embodiment of the present invention.

Embodiment of FIG. 4

Though the main semiconductor device component for protection purpose in a typical, unidirectional or bidirectional, assembled device is a conventional unidirectional diode, however, it can be constructed of a diode, a transistor, a thyristor, an assembled device, or a circuit that functions the same as a conventional unidirectional or bidirectional transient voltage suppressing and electrostatic discharge protection device.

FIG. 4 is a cross-sectional view illustrating the semiconductor construction of a unidirectional assembled device of the present invention. The device 400 is fabricated in accordance with a preferred embodiment of the present invention. Equivalent circuit of the unidirectional assembled device 400 is the same as that shown in FIG. 1B.

The unidirectional assembled device 400 comprises a p-type semiconductor substrate, or substrate 401. An n+ buried layer (NBL) 411 is disposed on the substrate surface 405, and an n− epitaxial layer 402 is grown over NBL 411 on the substrate surface 405. The epitaxial layer 402 is used as the device layer 403, where diode components, D1 451, D2 452 and D3 453, are fabricated. There are trench regions 420 formed around diode components 451-453. The trench region 420 isolates the diode component D1 451 from the diode components D2 452 and D3 453, to avoid interference among them. A heavily doped n+ diffused region 415 is disposed on the epitaxial surface 406 of the n− epitaxial layer 402. This n+ diffused region 415 serves to change the dopant concentration of n-type doped side of p-n junction of the diode component D3 453 in order to obtain appropriate breakdown voltage for the diode component D3 453. Three p+ diffused regions 416 are formed on the epitaxial layer 402, and act as anodes of diode components D1-D3 451-453.

For the unidirectional assembled device 400, the main semiconductor device component D3 453 (schematically shown as a Zener diode and labeled as D3 in the equivalent circuit of FIG. 1B) and the capacitance cancellation diode component D2 452 are fabricated on the same one island 422. The semiconductor island 422 is surrounded by trenches 420 and NBL region 411. The series connection of the D3 453 and D2 452 diode components is connected in parallel with the current bypassing diode component D1 451, which is constructed on another island 422, and also surrounded by trenches 420 and an NBL region 411.

Thus, the main semiconductor device component is constructed of a p+/n+/n−/n+ structure, as encircled and labeled as D3 453 in FIG. 4. Both diode components, D2 452 and D1 451, are constructed of a p+/n−/n+ structure, and are clearly encircled and labeled in FIG. 4.

The p+ diffused region 416 of the device component D3 453 constitutes the anode 441 of this unidirectional device 400, and is electrically connected to the p+ diffused region 416 of component D1 451 via metal interconnection. The p+ diffused region 416 of diode component D2 452 is the cathode 442 of the device 400 and is connected to the n+ diffused region 415 of diode D1 451 via metal interconnection.

The one trench that surrounds the island serves as isolation purpose. The n+ side diffused layer 412 fabricated along the sidewalls of trench 420 is intended to reduce the series resistance between n+ NBL 411 region and the cathode 442 of diode component D1 451. Its presence may not be necessary if the series resistance is not of concern. The trench 420 can be filled with thermal oxide, plasma-enhanced oxide or nitride, TEOS (tetraethoxysilane) oxide, CVD (chemical vapor deposition) oxide and/or polysilicon.

Essentially, the entire semiconductor construction of the unidirectional assembled device 400 of FIG. 4 (namely the conventional unidirectional diode component D3 453, the capacitance cancellation diode component D2 452 and the current bypassing diode component D1 451, together depicted in the equivalent circuit of FIG. 1B as an entire device) is constructed inside the device layer 403 atop the substrate 401.

Preferably, this unidirectional assembled device 400 is packaged as a flip chip or in an assembly requiring co-planar electrode pads, i.e., all electrode pads of the assembled device are on the same surface of the semiconductor construction.

In one preferred embodiment of the present invention, this semiconductor assembled device 400 is fabricated using the substrate 401 as a foundation to subsequently construct all the three component diodes atop in a sequence of fabrication procedural step to be described below.

The silicon device layer 403 used to construct the assembled device 400 can be one epitaxially grown on a silicon substrate 401. With this epitaxial technique, doping concentration of n− epitaxial layer 402 is low in the range between about 1E15 to 1E13 atoms/cm$^3$, which is much lower than that obtained from the diffusion technique. Thus, both CD1 and CD2 in the device capacitance equation (1) can be very low.

Fabrication of the device of FIG. 4 can be exemplified in a procedure illustrated in FIGS. 12A-12K, in which cross-sectional views of the diode device of FIG. 4 illustrating the device semiconductor construction at selected fabrication stages are shown. This illustrated fabrication procedure is based on the epitaxial technique described above and typically comprises the following steps:

1. Starting with the handling substrate 1201 (FIG. 12A), p-type substrate, 0.003-20 ohm-cm, thickness of 200-925 μm.

2. On the top surface of the handling substrate 1201 of FIG. 12A, deposit n-type dopant material, e.g., Antimony or Arsenic, by solid or gas phase deposition, or implant n-type material using ion implantation.

Figure 12A:
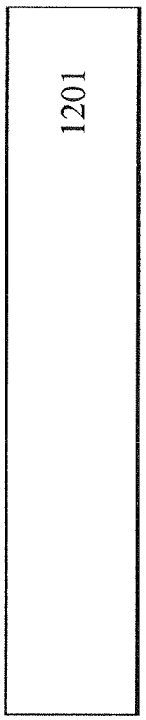
Figure 12B:
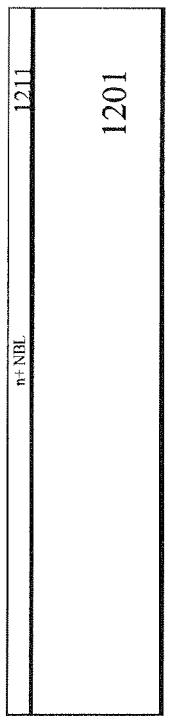

3. The n-type dopant material on the top surface of the handling substrate is driven into the silicon substrate 1201 to form an n+ buried layer (NBL) 1211. (FIG. 12B)

Figure 12C:
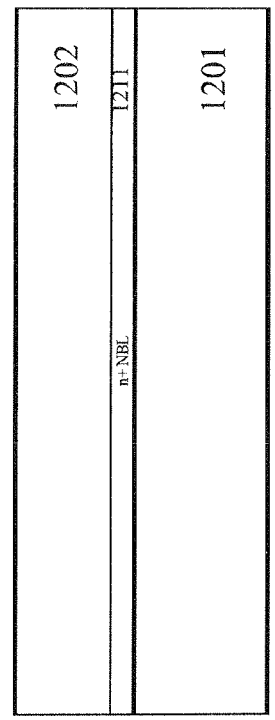

4. Grow an epitaxial layer 1202, n-type, 3-2,000 ohm-cm, thickness of 3-100 μm atop the NBL 1211. The epitaxial layer 1202 will serve as the device layer 1203. (FIG. 12C)

5. Grow an oxide layer 1231, about 2,000-10,000 Å, on surface of the epitaxial layer 1202.

Figure 12D:
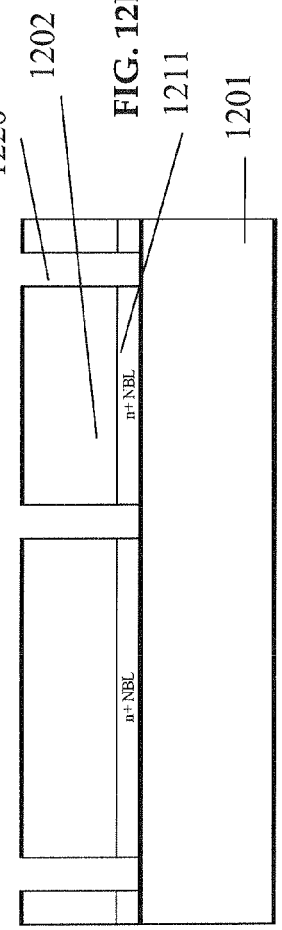

6. Define trench region 1220 by photolithography, etch oxide layer, and then etch the trench by high density plasma etcher from the top surface down through n+NBL layer 1211 and reaching to the handling substrate 1201. (FIG. 12D). Process the trench 1220 to leave a thick oxide at the bottom of the trench.

7. Process the sidewalls of the trench 1220 by ion implantation or other techniques using phosphorus to form n+ sidewall diffused region 1212. (FIG. 12E)

8. Fill the trench 1220 by growing thermal oxide on the sidewalls of the trench, and deposit plasma enhanced oxide or nitride, or TEOS oxide, or CVD oxide, and/or polysilicon.

9. Planarize the top surface by plasma etch back and/or polishing technique, e.g., chemical polishing or chemical-mechanical polishing (CMP) technique. (FIG. 12F)

10. Form an oxide layer of thickness 2,000-10,000 Å on the top surface of the device layer 1203.

11. Define by photolithography and etch oxide in the area for forming n+ region 1215.

Figure 12G:
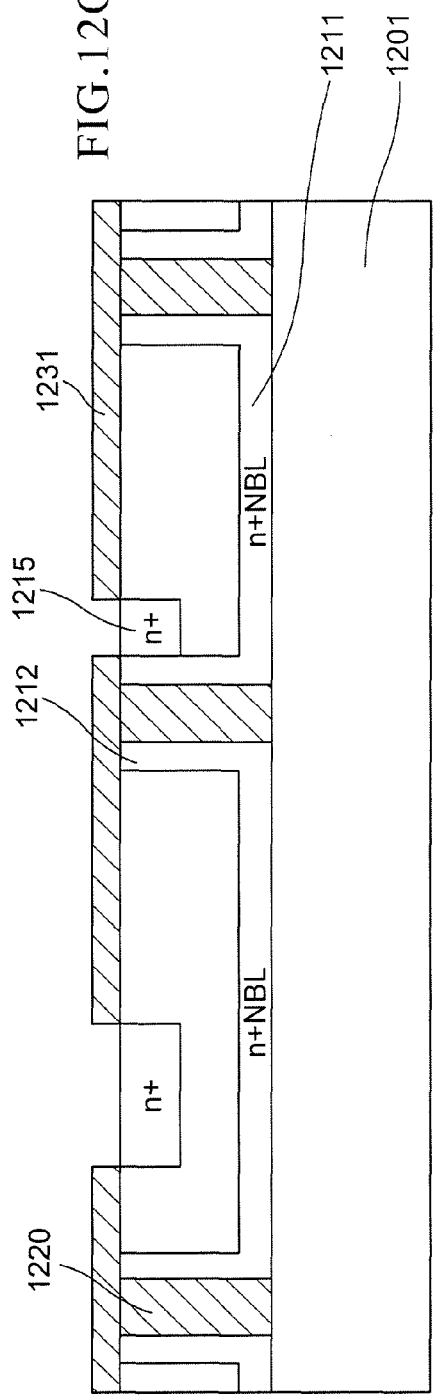

12. Deposit n-type dopant material, e.g., phosphorus, by $POCl_3$ or ion implantation, or Arsenic by ion implantation, and drive in by high temperature diffusion to the depth of about 1.5-4.5 µm. (FIG. 12G)

13. Define by photolithography and etch oxide in the area for forming p+ region 1216.

Figure 12H:
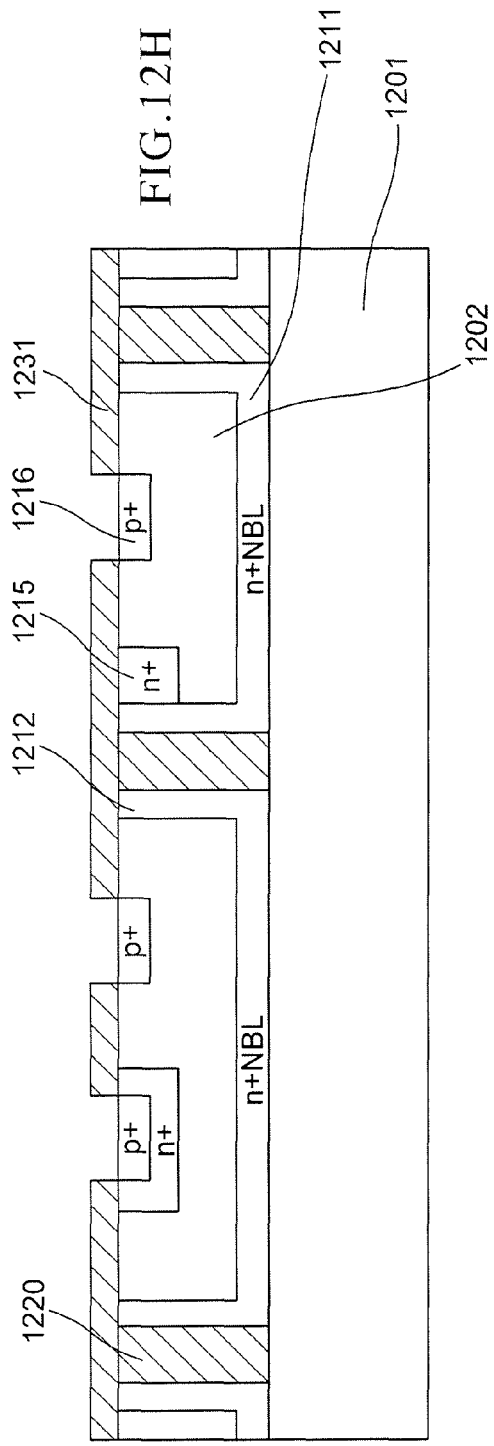

14. Deposit p-type dopant material, e.g., Boron, by solid or gas phase deposition or ion implantation technique, and drive in by high temperature diffusion to the depth of 0.5-3.0 µm. Adjust high temperature diffusion condition so that the breakdown voltage between cathode and anode of the assembled device is set to the targeted voltage. (FIG. 12H)

Figure 12I:
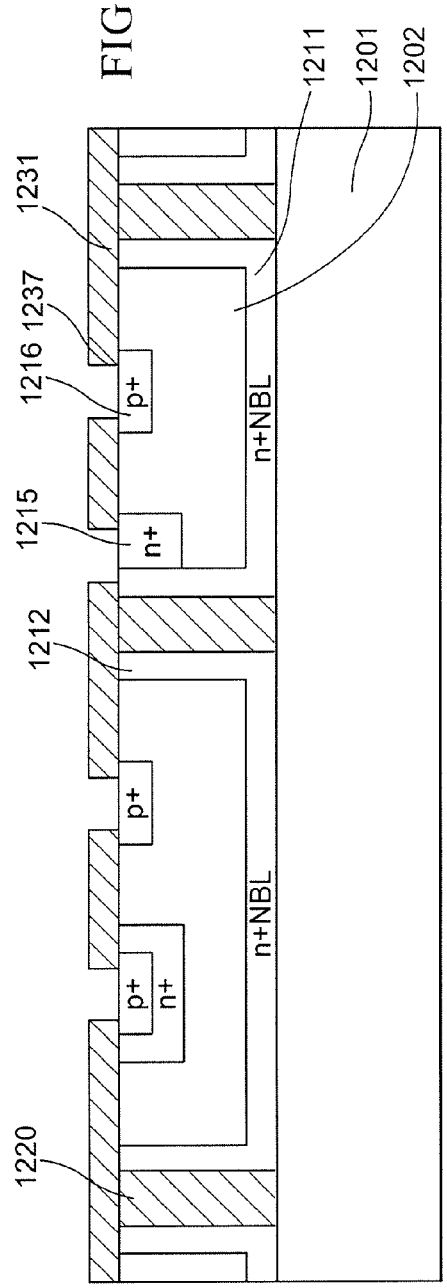

15. Define by photolithography and etch oxide in the contact region 1237. (FIG. 12I)

16. Deposit front metal 1233, e.g., Al, or AlSi alloy, or AlSiCu alloy, or Ti—Al, or Ti—AlSi, or Ti—AlSiCu, or Ti—Ni—Ag, or Ti—Ni—Au, of thickness 1-5 µm.

Figure 12J:
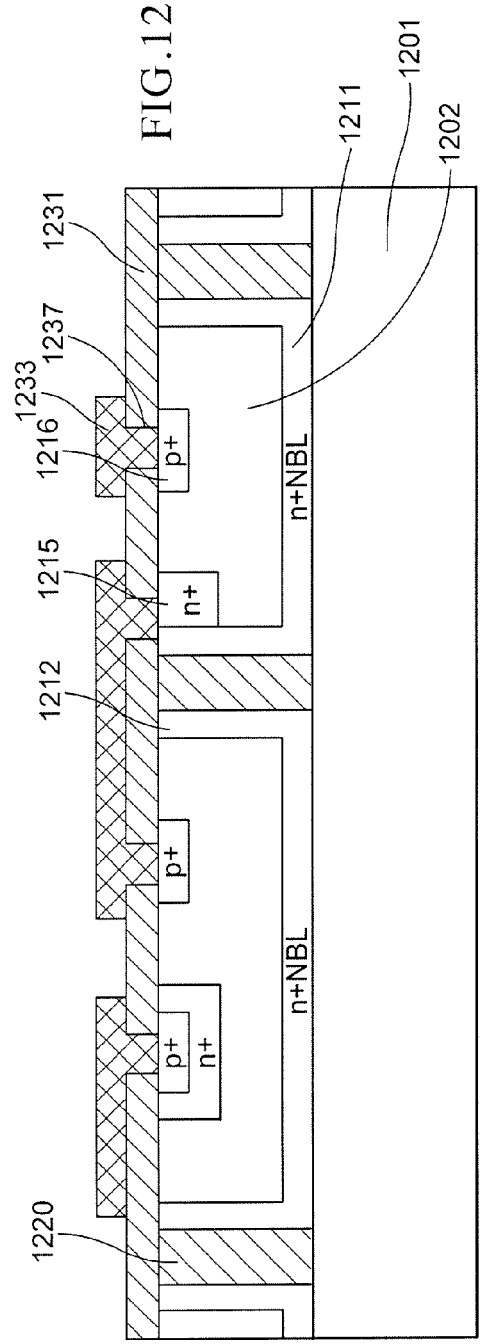

17. Define by photography and etch metal in the area for metal bonding pad and metal interconnection. (FIG. 12J)

18. Deposit a passivation layer 1232, e.g., CVD oxide, plasma-assisted nitride or oxynitride, of thickness 2,000-10,000 Å.

19. Define by photography and etch passivation layer in the area of pad region

Figure 12K:
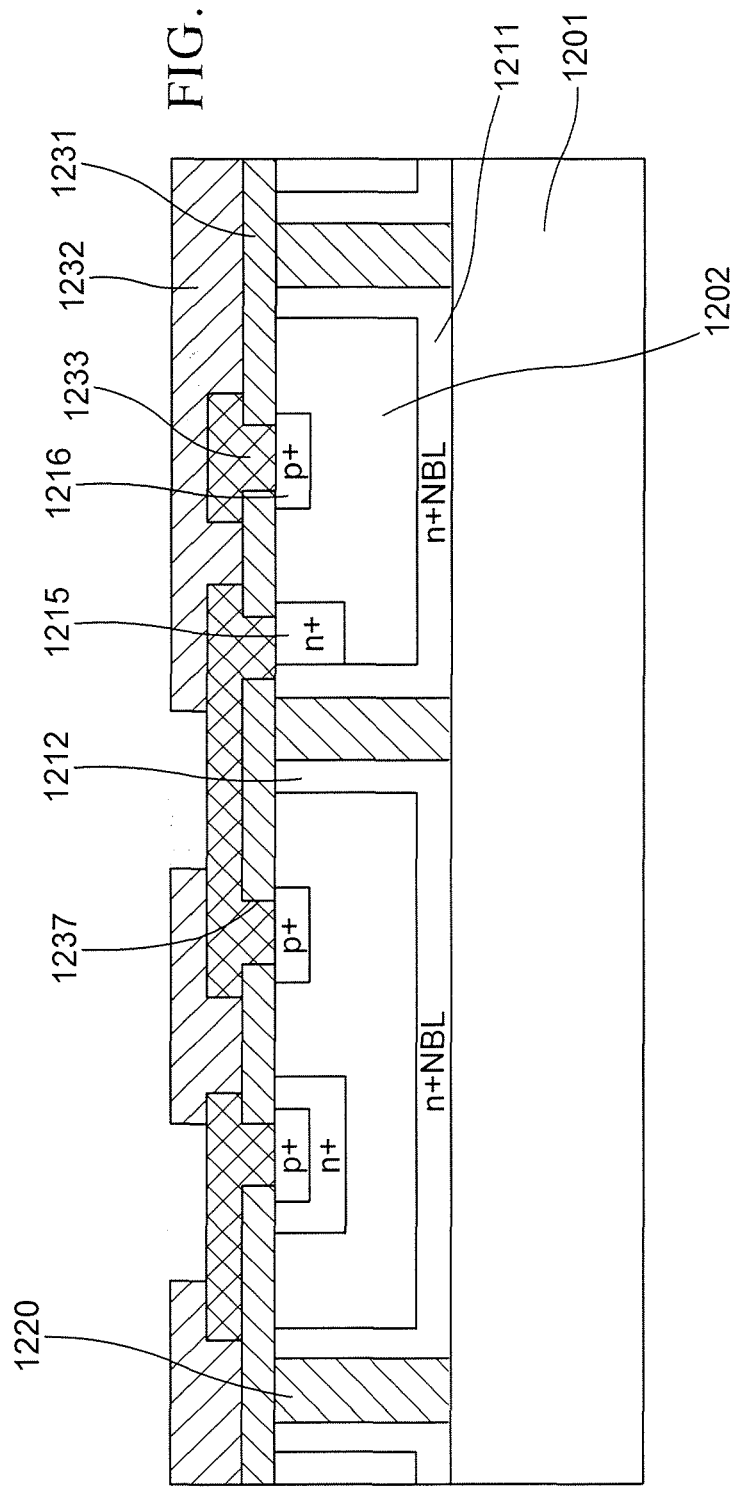

20. Background the handling substrate to a thickness appropriate for die bonding purpose in the package process or for flip-chip application. (FIG. 12K)

Figure 5:
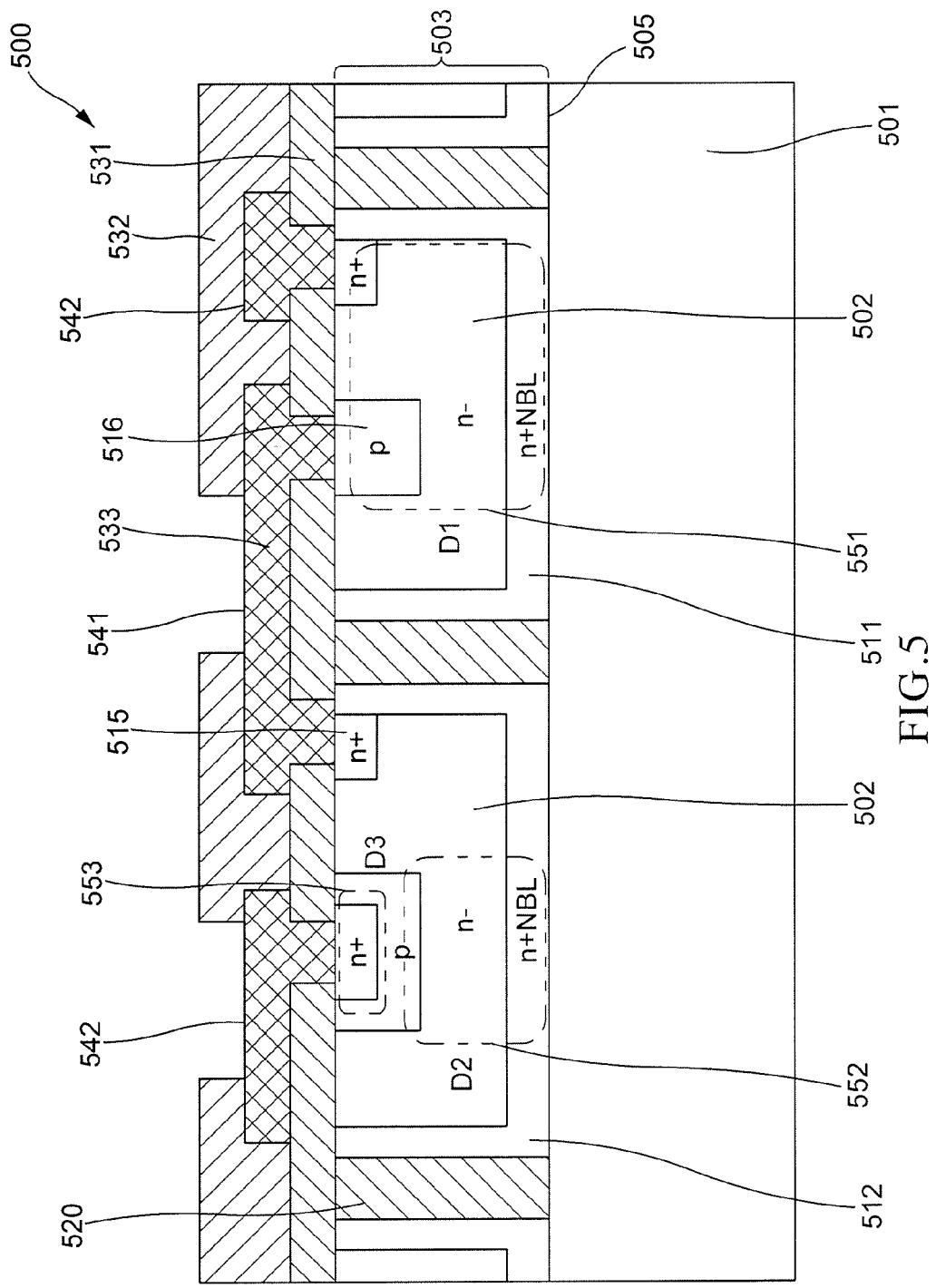
FIG. 5 is a cross-sectional view illustrating the semiconductor construction of another unidirectional assembled device, with equivalent circuit the same as that shown in FIG. 1C, fabricated in accordance with another embodiment of the present invention.

Embodiment of FIG. 5

FIG. 5 is a cross-sectional view illustrating the semiconductor construction of another unidirectional assembled device of the present invention. The device 500 is fabricated in accordance with a preferred embodiment of the present invention. Equivalent circuit of the unidirectional assembled device 500 is the same as that shown in FIG. 1C.

The unidirectional assembled device 500 comprises a p-type semiconductor substrate, or substrate 501. An n+ buried layer (NBL) 511 is disposed on the substrate surface 505, and an n− epitaxial layer 502 is grown over NBL 511 on the substrate surface 505. The epitaxial layer 502 is used as the device layer 503, where diode components, D1 551, D2 552 and D3 553, are fabricated. There are trench 520 regions formed around diode components 551-553. The trench 520 region isolates the diode component D1 551 from the diode components D2 552 and D3 553, to avoid interference among them. Two p-type diffused regions 516 are disposed on the epitaxial surface 506 of the n− epitaxial layer 502. A heavily doped n+ diffused region 515 is formed inside one of the area of p-type diffused region 516. This n+ diffused region 515 acts as cathode of diode component D3 551. The p-type diffused region 516 underneath the n+ diffused region 515 acts as anode of the diode components D2 552 and D3 553, and also serves as the base of an open base n-p-n bipolar transistor. Another p-type diffused region 516 acts as the anode of the diode component D1 551. The breakdown voltage of the assembled device 500 is then the open-base emitter-to-collector breakdown voltage of the n-p-n transistor. The breakdown voltage can be adjusted by appropriately applying fabrication technique of the conventional bipolar transistor.

For the unidirectional assembled device 500, the main semiconductor device component D3 553 and the capacitance cancellation diode component D2 552 are integrated into an open-base n-p-n bipolar transistor, and are fabricated on the same one island 522. The semiconductor island 522 is surrounded by trenches 520 and NBL 511 region. The integrated structure is connected in parallel with the current bypassing diode component D1 551, which is constructed on another island, and also surrounded by trenches 520 and an NBL 511 region.

Thus, the main semiconductor device component D3 553 and diode component D2 552 are integrated as an open-base n-p-n bipolar transistor and constructed of an n+/p/n−/n+ structure, as shown in FIG. 5. The diode component D1 551 is constructed of a p+/n−/n+ structure as encircled and labeled in FIG. 5.

The n+ diffused region 515, i.e., the n+ emitter of the n-p-n transistor, of the device component D3 553 constitutes the cathode of this unidirectional device 500, and is electrically connected to the n+ diffused region 515 of component D1 551 via metal interconnection. The n+ diffused region 515, which connects to the n+ collector of the n-p-n transistor, of diode component D2 552 forms as the anode of the device 500 and is connected to the p+ diffused region 516 of diode D1 551 via metal interconnection.

The one trench that surrounds the island serves as isolation purpose. The n+ side diffused region 512 fabricated along the sidewalls of trench 520 is intended to reduce the series resistance between n+ NBL 511 region and the cathode of diode component D1 551, and the series resistance of the collector of n-p-n transistor, from the n+ NBL 511 region to the electrode on the front surface of the device layer. Its presence may not be necessary if the series resistance is not of concern. The trench 520 can be filled with thermal oxide, plasma-enhanced oxide or nitride, TEOS (tetraethoxysilane) oxide, CVD (chemical vapor deposition) oxide and/or polysilicon.

Essentially, the entire semiconductor construction of the unidirectional assembled device 500 of FIG. 5 (namely the conventional unidirectional diode component D3 553, the capacitance cancellation diode component D2 552 and the current bypassing diode component D1 551, together depicted in the equivalent circuit of FIG. 1C as an entire device) is constructed inside the device layer 503 atop the substrate 501.

Preferably, this unidirectional assembled device 500 is packaged as a flip chip or in an assembly requiring co-planar electrode pads, i.e., all electrode pads of the assembled device are on the same surface of the semiconductor construction.

In one preferred embodiment of the present invention, this semiconductor assembled device 500 is fabricated using the substrate 502 as a foundation to subsequently construct all the three component diodes atop in a sequence of fabrication procedural step the same as that described in the embodiment of FIG. 4.

The silicon device layer 503 used to construct the assembled device 500 can be one epitaxially grown on a silicon substrate 501. With this epitaxial technique, doping concentration of n− epitaxial layer is low in the range between about 1E15 to 1E13 atoms/$cm^3$, which is much lower than that obtained from the diffusion technique. Thus, both $C_{D1}$ and $C_{D2}$ in the device capacitance equation (1) can be very low.

Figure 6:
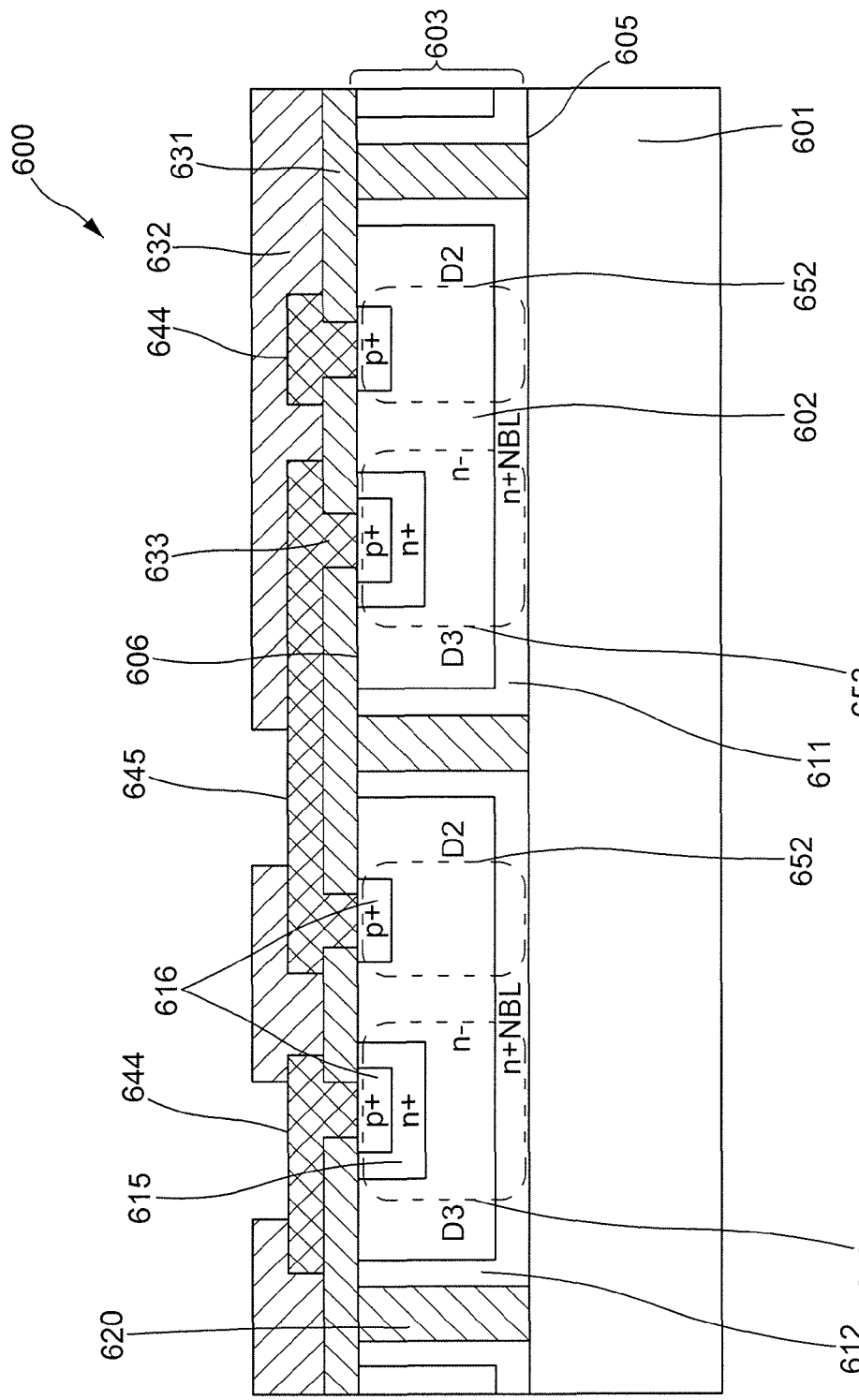
FIG. 6 is a cross-sectional view illustrating the semiconductor construction of a bidirectional assembled device, with equivalent circuit the same as that shown in FIG. 2B, fabricated in accordance with a preferred embodiment of the present invention.

Embodiment of FIG. 6

FIG. 6 is a cross-sectional view illustrating the semiconductor construction of a bidirectionally assembled device of the present invention. The device is fabricated in accordance with a preferred embodiment of the present invention. Equivalent circuit of the bidirectionally assembled device is the same as that shown in FIG. 2B.

The bidirectional assembled device 600 comprises a p-type semiconductor substrate 601. An n+ buried layer (NBL) 611 is disposed on the substrate surface 605, and an n– epitaxial layer 602 is grown over NBL 611 on the substrate surface 605. The epitaxial layer 602 is used as the device layer 603, where a pair of diode components, D2 652 and D3 653, is fabricated on the same one island 622. Two pairs of diode components 652-653 are formed in the device layer 603. Each semiconductor island 622 is surrounded by trenches 620 and NBL 611 region. The trench region 620 isolates the one pair of diode components 652-653 from the other pair, to avoid interference between them. A heavily doped n+ diffused region 615 is disposed in each island 622, on the epitaxial surface 606 of the n– epitaxial layer 602. The n+ diffused region 615 serves to change the dopant concentration of n-type doped side of p-n junction of the diode component D3 653 in order to obtain appropriate breakdown voltage for the diode component D3 653. Two p+ diffused regions 616 are formed in each semiconductor island 622, on the epitaxial layer 602, and act as anode of diode components D2 652 and D3 653.

Thus, the main semiconductor device component D3 653 is constructed of a p+/n+/n–/n+ structure, as encircled and diode components D2 652 is constructed of a p+/n–/n+ structure, as shown in FIG. 6.

The p+ diffused region 616 of the device component D3 653 in one island 622 is electrically connected to the p+ diffused region 616 of device component D1 651 in the other island 622 via metal interconnection, and an electrode of the bidirectional assembled device 600. Two electrodes are formed on the front surface of the device layer 603.

The one trench 620 that surrounds the island 622 serves as isolation purpose. The n+ side diffused region 612 fabricated along the sidewalls of trench 620 is made in conventionally, but its presence may not be necessary. The trench 620 can be filled with thermal oxide, plasma-enhanced oxide or nitride, TEOS (tetraethoxysilane) oxide, CVD (chemical vapor deposition) oxide and/or polysilicon.

Figure 2D:
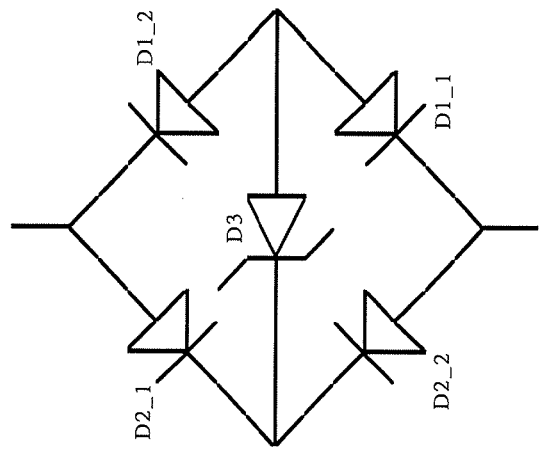
FIG. 2D shows the equivalent circuit of yet another bidirectional assembled device.
Figure 2C:
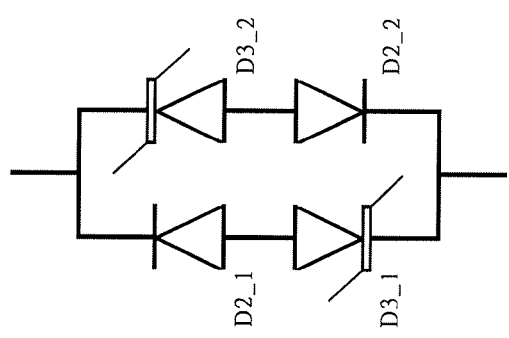
FIG. 2C shows the equivalent circuit of another bidirectional assembled device.
Figure 2B:
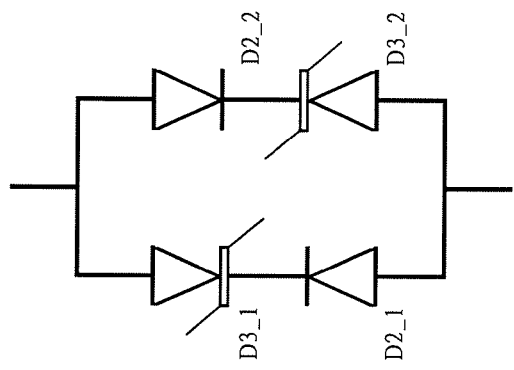
FIG. 2B shows the equivalent circuit of a bidirectional assembled device.
Figure 2A:
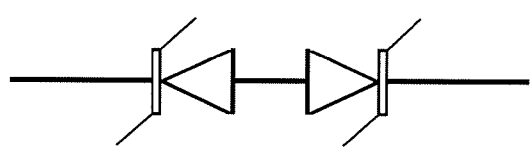
FIG. 2A shows the symbol of a conventional bidirectional diode.

Essentially, the entire semiconductor construction of the bidirectionally assembled device 600 of FIG. 6 (namely two pairs of back-to-back connected diode components D3 653 and D2 652, arranged in an anti-parallel configuration, together depicted in the equivalent circuit of FIG. 2B as an entire device) is constructed inside the device layer 603 atop the substrate 601.

Preferably, this bidirectional assembled device 600 is packaged as a flip chip or in an assembly requiring co-planar electrode pads, i.e., all electrode pads of the assembled device are on the same surface of the semiconductor construction.

In one preferred embodiment of the present invention, this semiconductor assembled device is fabricated using the substrate as a foundation to subsequently construct all the four component diodes atop in a sequence of fabrication procedural step to be described the same as that described in the embodiment of FIG. 4.

The silicon device layer 603 used to construct the assembled device 600 can be one epitaxially grown on a silicon substrate 601. With this epitaxial technique, doping concentration of n– epitaxial layer is low in the range between about 1E15 to 1E13 atoms/cm$^3$, which is much lower than that obtained from the diffusion technique. Thus, $C_{D2}$ in the device capacitance equation (I) can be very low.

Figure 7:
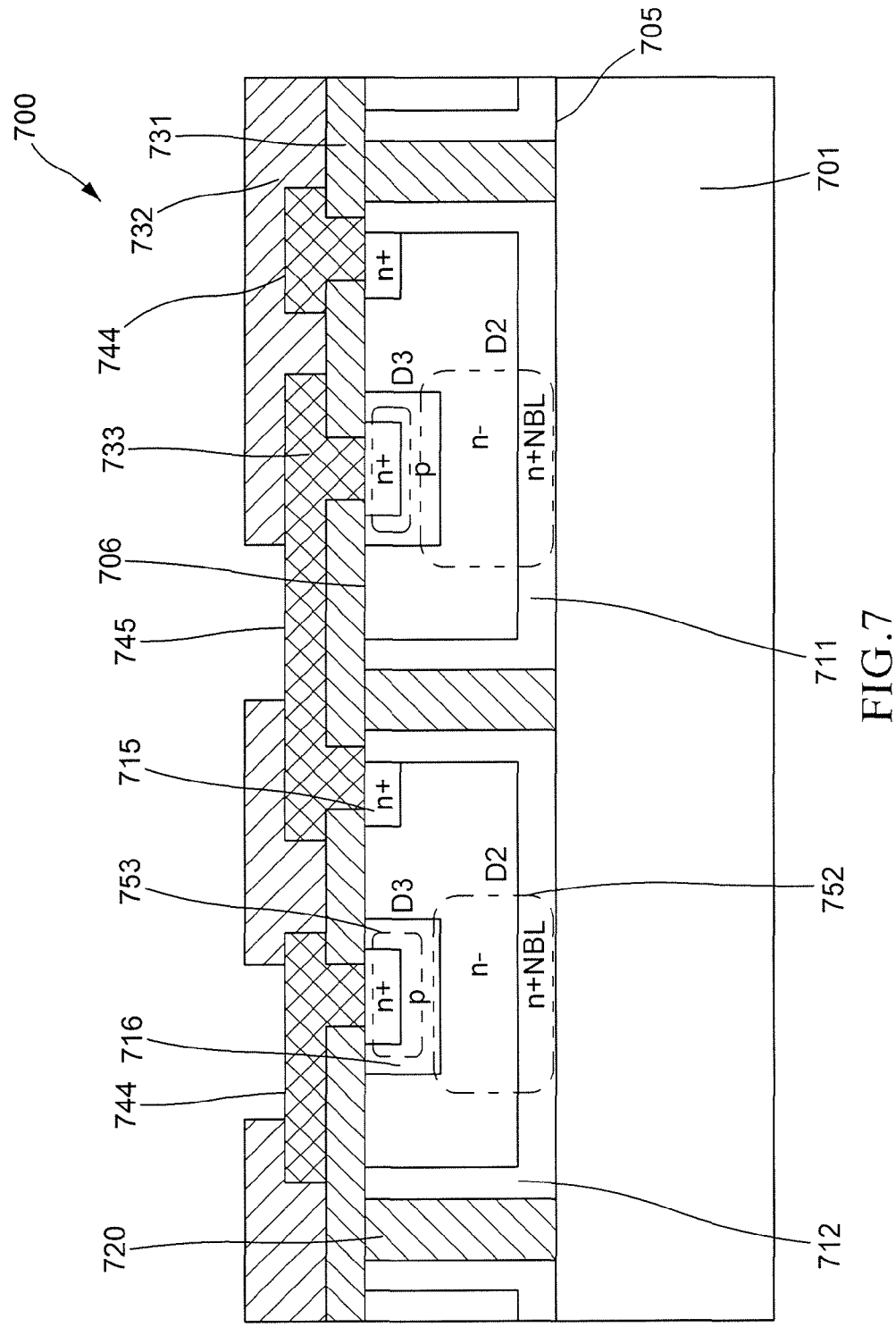
FIG. 7 is a cross-sectional view illustrating the semiconductor construction of another bidirectional assembled device, with equivalent circuit the same as that shown in FIG. 2C, fabricated in accordance with another preferred embodiment of the present invention.

Embodiment of FIG. 7

FIG. 7 is a cross-sectional view illustrating the semiconductor construction of another bidirectional assembled device of the present invention. The device is fabricated in accordance with a preferred embodiment of the present invention. Equivalent circuit of the bidirectionally assembled device is the same as that shown in FIG. 2C.

The bidirectional assembled device 700 comprises a p-type semiconductor substrate 701. An n+ buried layer (NBL) 711 is disposed on the substrate surface 705, and an n– epitaxial layer 702 is grown over NBL 711 on the substrate surface 705. The epitaxial layer 702 is used as the device layer 703, where a pair of diode components, D2 752 and D3 753, is fabricated on the same one island 722. Two pairs of diode components 752-753 are formed in the device layer 703. Each semiconductor island 722 is surrounded by trenches 720 and NBL 711 region. The trench region 720 isolates the one pair of diode components 752-753 from the other pair, to avoid interference between them. A p-type diffused region 716 is disposed in each island 722, on the epitaxial surface 706 of the n– epitaxial layer 702. A heavily doped n+ diffused region 715 is formed inside each area of p-type diffused region 716. This n+ diffused region 715 acts as cathode of diode component D3 753. The p-type diffused region 716 underneath the n+ diffused region 715 acts as anode of the diode components D2 752 and D3 753, and also serves as the base of an open base n-p-n bipolar transistor. The breakdown voltage of the assembled device 700 is then the open-base emitter-to-collector breakdown voltage of the n-p-n transistor. The breakdown voltage can be adjusted by appropriately applying fabrication technique of the conventional bipolar transistor.

Thus, the main semiconductor device component D3 753 and diode component D2 752 are integrated into an open-base n-p-n bipolar transistor, and constructed of an n+/p/n–/n+ structure, as shown in FIG. 7.

The n+ diffused region 715, i.e., the n+ emitter of the n-p-n transistor, of the device component D3 753 in one island 722 is electrically connected to the n+ diffused region 715, which connects to the n+ collector of the n-p-n transistor, of device component D3 753 in the other island 722 via metal interconnection, and forms an electrode of the bidirectional assembled device 700. Two electrodes are formed on the front surface of the device layer 703.

The one trench 720 that surrounds the island 722 serves as isolation purpose. The n+ side diffused region 712 fabricated along the sidewalls of trench 720 is intended to reduce the series resistance of the collector of n-p-n transistor, from the n+ NBL region 711 to the electrode on the front surface of the device layer 703. The trench 720 can be filled with thermal oxide, plasma-enhanced oxide or nitride, TEOS (tetraethoxysilane) oxide, CVD (chemical vapor deposition) oxide and/or polysilicon.

Essentially, the entire semiconductor construction of the bidirectional assembled device 700 of FIG. 7 (namely two pairs of back-to-back connected diode components D3 753 and D2 752, integrated as an open-base n-p-n bipolar transistor configuration, together depicted in the equivalent circuit of FIG. 2C as an entire device) is constructed inside the device layer 703 atop the substrate 701.

Preferably, this bidirectional assembled device 700 is packaged as a flip chip or in an assembly requiring co-planar electrode pads, i.e., all electrode pads of the assembled device are on the same surface of the semiconductor construction.

In one preferred embodiment of the present invention, this semiconductor assembled device is fabricated using the substrate as a foundation to subsequently construct all the three component diodes atop in a sequence of fabrication procedural step the same as that described in the embodiment of FIG. 4.

The silicon device layer 703 used to construct the assembled device 700 can be one epitaxially grown on a silicon substrate. With this epitaxial technique, doping concentration of n− epitaxial layer 702 is low in the range between about 1E15 to 1E13 atoms/cm³, which is much lower than that obtained from the diffusion technique. Thus, $C_{D2}$ in the device capacitance equation (1) can be very low.

Figure 8:
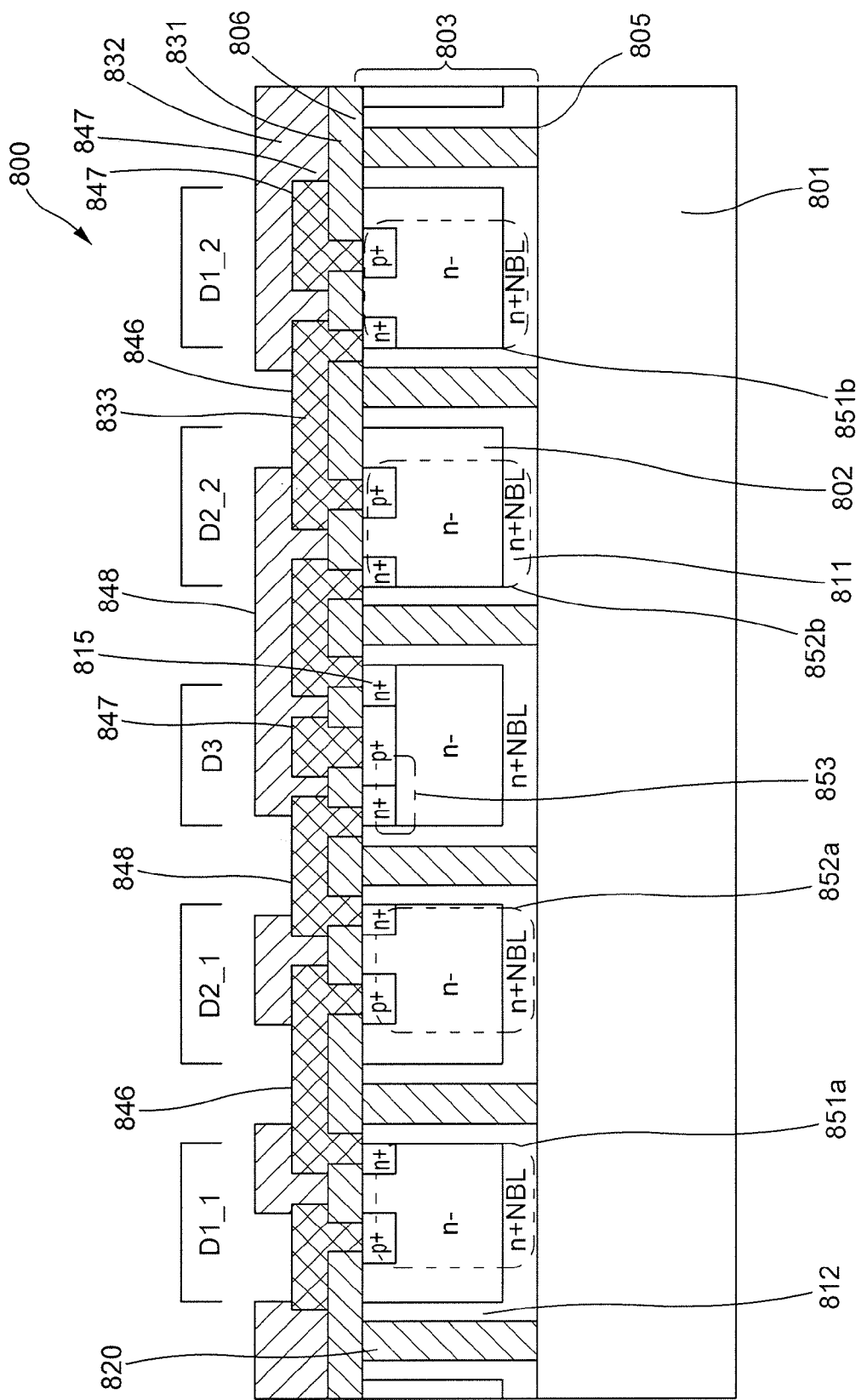
FIG. 8 is a cross-sectional view illustrating the semiconductor construction of a two-channel unidirectional assembled device array fabricated in accordance with a preferred embodiment of the present invention.

Embodiment of FIG. 8

FIG. 8 is a cross-sectional view illustrating the semiconductor construction of a unidirectional assembled device array 800 of the present invention. The device is fabricated in accordance with a preferred embodiment of the present invention. Equivalent circuit of the unidirectional assembled device array 800 is the same as that shown in FIG. 3A.

Figures 3A, 3B:
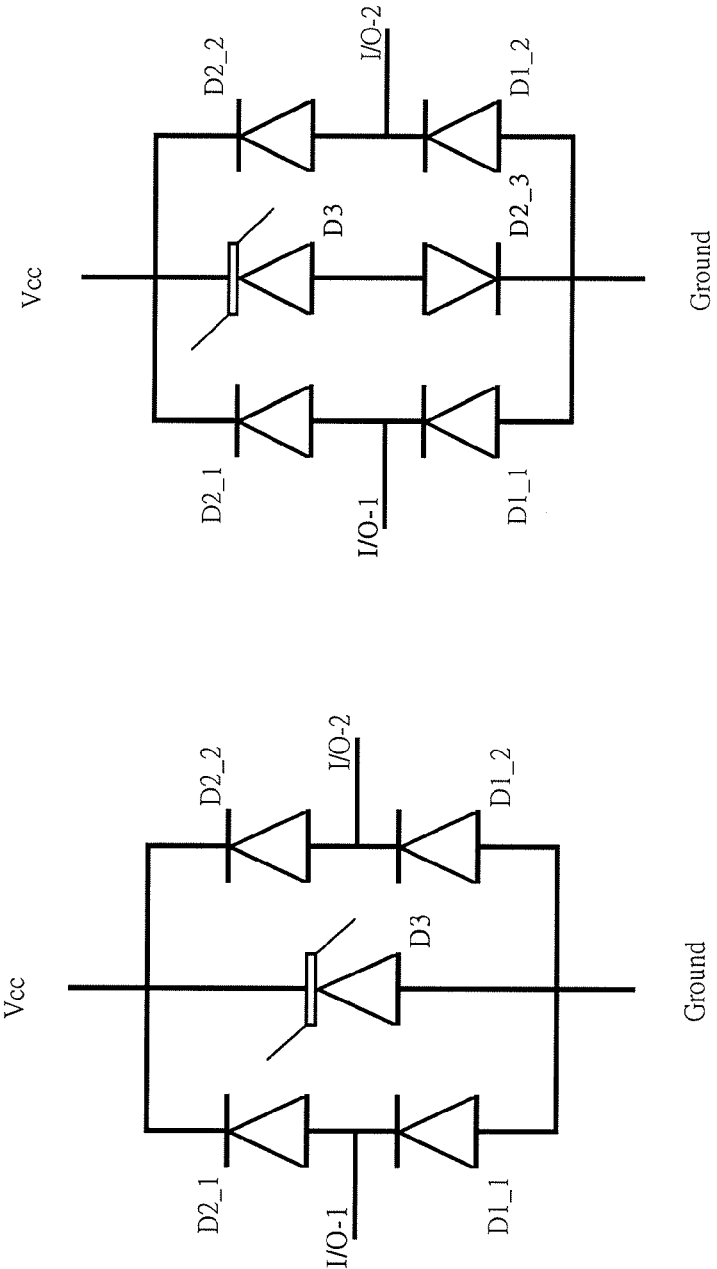
FIG. 3A shows the equivalent circuit of a two-channel unidirectional assembled device array.
FIG. 3B shows the equivalent circuit of another two-channel unidirectional assembled device array.

Comparing FIG. 3A to FIG. 2D, it can be seen that this unidirectional assembled device array is equivalent to a bidirectionally assembled device when two I/O pins are assigned as the two electrodes in the bidirectional assembled device.

The assembled device array 800 comprises a p-type semiconductor substrate 801. An n+ buried layer (NBL) 811 is disposed on the substrate surface 805, and an n− epitaxial layer 802 is grown over NBL 811 on the substrate surface 805. The epitaxial layer 802 is used as the device layer 803, where device components, D1 851, D2 852 and D3 853, are fabricated. There are trench 820 regions formed around each diode component, to avoid interference among them. Each device component is formed in an individual island 822, surrounded by trench 820 and separated by n+ NBL region 811. A heavily doped n+ diffused region 815 is disposed on the epitaxial surface 806 of the n− epitaxial layer 802. This n+ diffused region 815 serves to change the dopant concentration of n-type doped side of p-n junction of the diode component D3 853 in order to obtain appropriate breakdown voltage for the diode component D3 853. A p+ diffused region 816 is formed on the epitaxial layer 802, and forms the anode of device components D1-D3 851-853.

The main semiconductor device component D3 853 is constructed of a p+/n+/n−/n+ structure, while device components, D2 852 and D1 851, are constructed of a p+/n−/n+ structure, as shown in FIG. 8.

The p+ diffused region 816 of the device component D3 853 constitutes the ground 847 of this unidirectional device array 800, and is electrically connected to the p+ diffused region 816 of components D1_1 851a and D1_2 851b via metal interconnection. The n+ diffused region 815 of device component D3 853 constitutes the Vcc electrode 848, and is electrically connected to the n+ diffused region 815 of device components D2_1 852a and D2_2 852b via metal interconnection. The p+ diffused regions 816 of diode components D2_1 852a and D2_2 852b are connected to the n+ diffused regions 815 of diode D1_1 851a and D1_2 851b via metal interconnection, separately, and forms an I/O electrode 846. There are two I/O electrodes 846 form on the front surface of the device layer 803.

The one trench 820 that surrounds the island 822 serves as isolation purpose. The n+ side diffused region 812 fabricated along the sidewalls of trench 820 is intended to reduce the series resistance between n+ NBL region 811 and the cathode of diode component D1 851. Its presence may not be necessary if the series resistance is not of concern. The trench 820 can be filled with thermal oxide, plasma-enhanced oxide or nitride, TEOS (tetraethoxysilane) oxide, CVD (chemical vapor deposition) oxide and/or polysilicon.

Essentially, the entire semiconductor construction of the unidirectional assembled device array 800 of FIG. 8, (namely two sets of unidirectional assembled device with equivalent circuit of FIG. 1B, depicted in the equivalent circuit of FIG. 3A as an entire device) is constructed inside the device layer 803 atop the substrate 801.

Preferably, this unidirectional assembled device 800 is packaged as a flip chip or in an assembly requiring co-planar electrode pads, i.e., all electrode pads of the assembled device are on the same surface of the semiconductor construction.

In one preferred embodiment of the present invention, this semiconductor assembled device is fabricated using the substrate as a foundation to subsequently construct all the component diodes atop in a sequence of fabrication procedural step the same as that described in the embodiment of FIG. 4.

The silicon device layer 803 used to construct the assembled device 800 can be one epitaxially grown on a silicon substrate 801. With this epitaxial technique, doping concentration of n− epitaxial layer 802 is low in the range between about 1E15 to 1E13 atoms/cm³, which is much lower than that obtained from the diffusion technique. Thus, both $C_{D1}$ and $C_{D2}$ in the device capacitance equation (1) can be very low.

Figure 9:
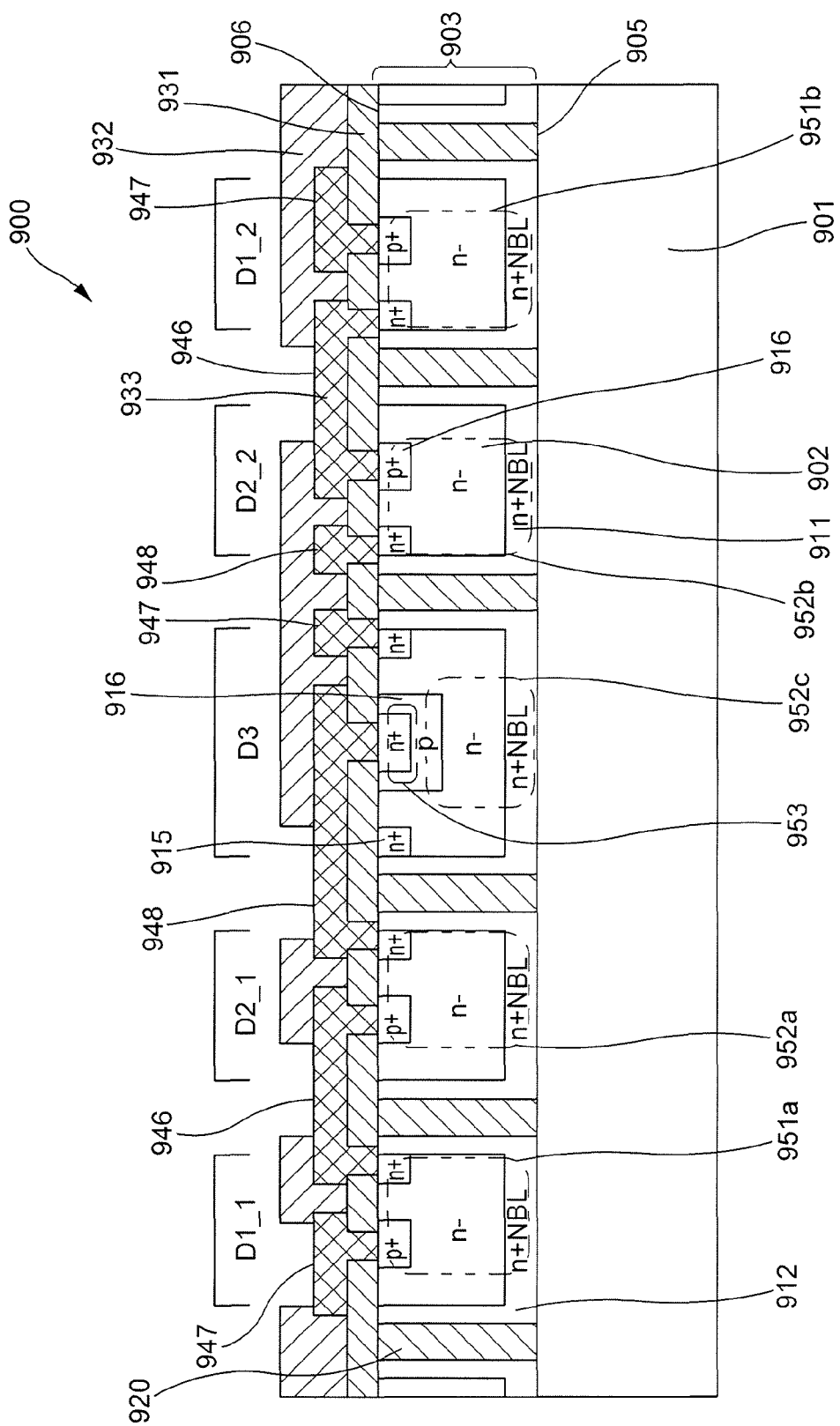
FIG. 9 is a cross-sectional view of another two-channel unidirectional assembled device array of the present invention.

Embodiment of FIG. 9

FIG. 9 is a cross-sectional view illustrating the semiconductor construction of another unidirectional assembled device array 900 of the present invention. The device is fabricated in accordance with a preferred embodiment of the present invention. Equivalent circuit of the unidirectional assembled device is the same as that shown in FIG. 3B.

This unidirectional assembled device array 900 is equivalent to a bidirectionally assembled device when two I/O pins are assigned as the two electrodes in the bidirectional assembled device. The main semiconductor device component in this structure is then an open-base n-p-n bipolar transistor.

The unidirectional assembled device array 900 comprises a p-type semiconductor substrate, or substrate 901. An n+ buried layer (NBL) 911 is disposed on the substrate surface 905, and an n− epitaxial layer 902 is grown over NBL 911 on the substrate surface 905. The epitaxial layer 902 is used as the device layer 903, where diode components, D1 951a-951b, D2 952a-952b and D3 953, are fabricated. There are trench regions 920 formed around each diode component, to avoid interference among them. Each device component is formed in an individual island 922, surrounded by trench 920 and separated by n+NBL region 911. A p-type diffused region 916 is disposed on the epitaxial surface 906 of the n-epitaxial layer 902. A heavily doped n+ diffused region 915 is formed inside one of the area of p-type diffused region 916. In the island 922 where the man device component D3 953 is formed, the n+ diffused region 915 acts as cathode of diode component D3 953, and the p-type diffused region 916 underneath the n+ diffused region 915 acts as the anode of diode components D2_3 952c and D3 953. The p-type diffused region 916 inside this island 922 also serves as the base of an open base n-p-n bipolar transistor. In other islands 922 where device components D1 951a-951b and D2 952a-952b are formed, the p-type diffused region 916 acts as the anode of the device components 951-953. The breakdown voltage of the assembled device 900 is then the open-base emitter-to-collector breakdown voltage of the n-p-n transistor. The breakdown voltage can be adjusted by appropriately applying fabrication technique of the conventional bipolar transistor.

The main semiconductor device component D3 953 and diode component D2_3 952c are integrated as an open-base n-p-n bipolar transistor and constructed of an n+/p/n−/n+ structure, while diode components D2 952a-952b and D1 951a-951b are constructed of a p+/n−/n+ structure as shown in FIG. 9.

The n+ diffused region 915, which connects to the n+ collector of the n-p-n transistor, of diode component D2_3 952c constitutes the ground 947 of this unidirectional assembled device array 900, and is connected to the p+ diffused region 916 of device components D1_1 951a and D1_2 951b via metal interconnection. The n+ diffused region 915, i.e., the n+ emitter of the n-p-n transistor, of the device component D3 953 constitutes the Vcc electrode 948, and is electrically connected to the n+ diffused region 915 of device components D2_1 952a and D2_2 952b via metal interconnection. The p+ diffused region 916 of device components D2_1 952a and D2_2 952b are connected to the n+ diffused region 915 of device components D1_1 951a and D1_2 951b via metal interconnection, separately, and forms an I/O electrode 946. There are two I/O electrodes 946 form on the front surface of the device layer 903.

The one trench 920 that surrounds the island 922 serves as isolation purpose. The n+ side diffused region 912 fabricated along the sidewalls of trench 920 is intended to reduce the series resistance between n+NBL region 911 and the cathode of diode components D1 951a-951b and D2 952a-952b, and the series resistance of the collector of n-p-n transistor, from the n+ NBL region 911 to the electrode on the front surface of the device layer 903. Its presence may not be necessary if the series resistance is not of concern. The trench 920 can be filled with thermal oxide, plasma-enhanced oxide or nitride, TEOS (tetraethoxysilane) oxide, CVD (chemical vapor deposition) oxide and/or polysilicon.

Essentially, the entire semiconductor construction of the unidirectional assembled device array 900 of FIG. 9, (namely two sets of unidirectional assembled device with equivalent circuit of FIG. 1C, depicted in the equivalent circuit of FIG. 3B as an entire device) is constructed inside the device layer 903 atop the substrate 901.

Preferably, this unidirectional assembled device array 900 is packaged as a flip chip or in an assembly requiring co-planar electrode pads, i.e., all electrode pads 946-948 of the assembled device 900 are on the same surface of the semiconductor construction.

In one preferred embodiment of the present invention, this semiconductor assembled device array is fabricated using the substrate as a foundation to subsequently construct all the three component diodes atop in a sequence of fabrication procedural step the same as that described in the embodiment of FIG. 4.

The silicon device layer 903 used to construct the assembled device 900 can be one epitaxially grown on a silicon substrate 901. With this epitaxial technique, doping concentration of n− epitaxial layer 902 is low in the range between about 1E15 to 1E13 atoms/cm$^3$, which is much lower than that obtained from the diffusion technique. Thus, both $C_{D1}$ and $C_{D2}$ in the device capacitance equation (1) can be very low.

Figure 14:
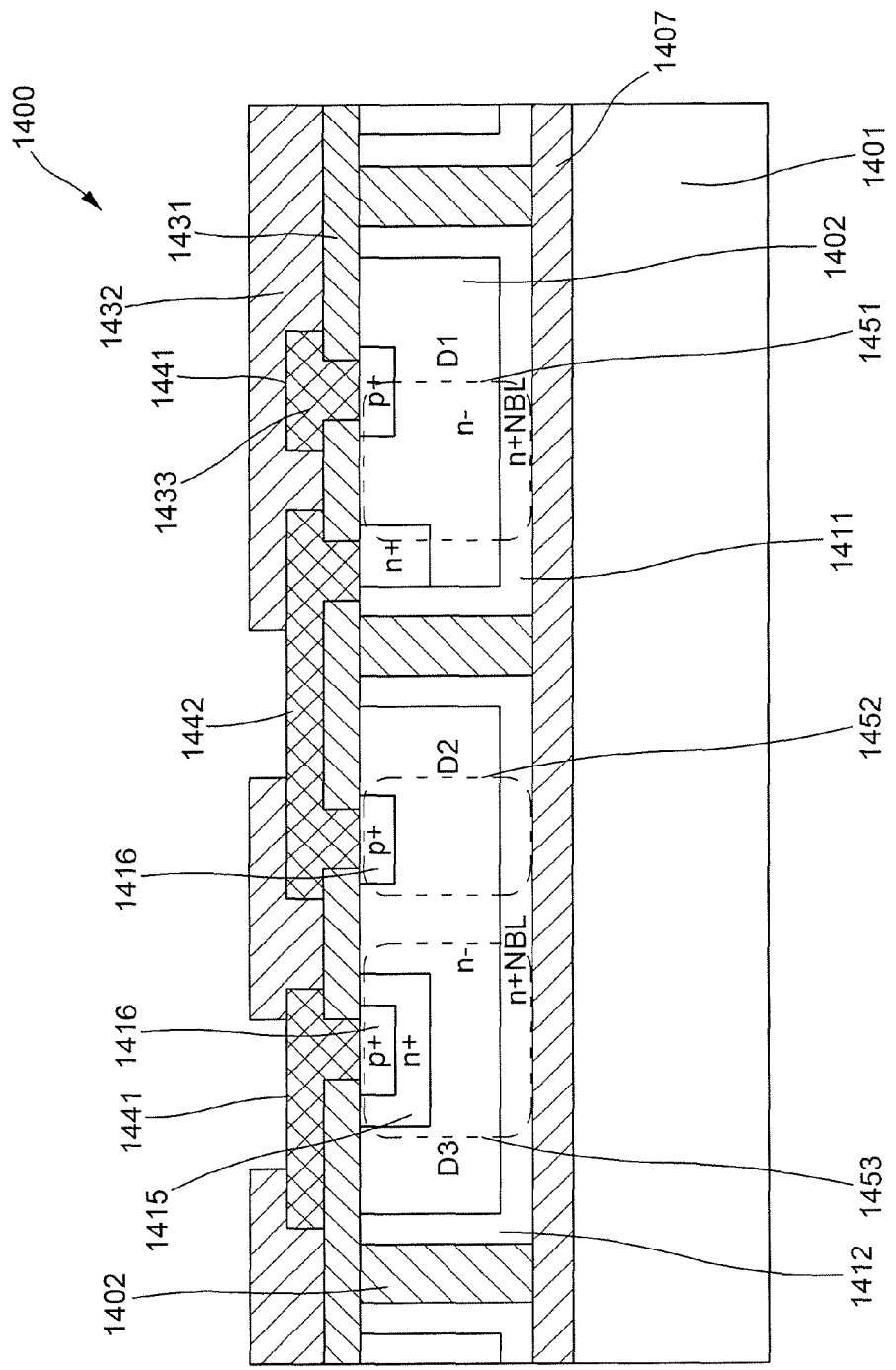
FIG. 14 is a cross-sectional view illustrating the semiconductor construction of a unidirectional assembled device, with equivalent circuit the same as that shown in FIG. 1B, fabricated using wafer bonding technique in accordance with a preferred embodiment of the present invention.

Embodiments of FIG. 14

Note that there are the following relationships between the lowest doping concentration achievable and consequently, the lowest resultant depletion-layer capacitance of the p-n junction among different techniques for the fabrication of regions of different atomic species doping:

$$N_{diffusion\ technology} > N_{epi\ technology} > N_{FZ\ wafer}$$

and $$C_{diffusion\ technology} > C_{epi\ technology} > C_{FZ\ wafer},$$

where N represents the lowest doping concentration achievable and C represents the lowest depletion-layer capacitance achievable, and FZ wafer means wafer made using floating zone technique, one that used to grow crystalline silicon ingots.

Referring to embodiments of FIGS. 4-9, the device layer is formed by epitaxial technology. In accordance with another preferred embodiment of the present invention, the device layer for which the semiconductor device components can be constructed out of their own is prepared in a device wafer and then bonded to a substrate via the implementation of a wafer bonding technology. In this case, an intermediate layer is prepared between the device layer and the handling substrate. The intermediate layer functions as an isolation layer or as an assistant for wafer bonding, and can be a layer of oxide, or polysilicon, grown or deposited, partially or completely, underneath the device layer and above the substrate of the device. The intermediate layer can be glass or ceramic. For example, the intermediate layer can be grown by thermal oxide, or deposited with plasma-enhanced oxide or nitride, TEOS oxide, CVD oxide and/or polysilicon on the bottom side of the device semiconductor wafer. This intermediate layer is then subject to an etch-back or polishing, either chemical or chemical-mechanical polishing, procedure to achieve a surface planarity that allows for its bonding with the handle substrate. Since the substrate is only for handling purpose, it can be a silicon, glass, or ceramic substrate.

Using this wafer bonding technique, the doping concentration of the n− region of the device layer in the structure can be very low, in the range of about 1E14 to 5E11 atoms/cm$^3$. This is possible by the use of a very high resistivity silicon wafer prepared using Czochralski (CZ) crystal growing technique, floating zone (FZ) crystal growing technique or neutron transmutation doping (NTD) technique. Thus, both $C_{D1}$ and $C_{D2}$ in the device capacitance equation can be made even lower than those prepared by epitaxial technology.

Each of the devices of FIGS. 4-9 can be constructed on the device layer prepared according to the above mentioned method. One example is shown in FIG. 14, which has the similar structure to that of FIG. 4. Structures of FIGS. 5-9 can be constructed the same way without further description.

Fabrication of device layer of the above mentioned method is exemplified in a procedure illustrated in FIGS. 13A-13D, in which cross-sectional views of the assembled devices of FIG. 14 illustrating the device semiconductor construction at selected fabrication stages for preparing the device layer on the handling substrate using the wafer bonding technique are shown. This illustrated fabrication procedure typically comprises the following steps:

1. Starting with the device wafer 1303, n-type substrate, 3-10,000 ohm-cm, thickness of 200-925 μm.

2. On the polished side, top surface of the device wafer 1303, deposit n-type dopant material, e.g., Antimony or Arsenic, by solid or gas phase deposition, or implant n-type material using ion implantation.

3. The n-type dopant material on the top surface of the device wafer 1303 is driven into the silicon wafer to form an n+ buried layer (NBL) 1311. (FIG. 13A)

4. Form an intermediate layer 1307 by growing a thermal oxide layer of 1,000-20,000 Å. Or grow a thin thermal oxide of 500-2,000 Å and then deposit plasma-enhanced oxide, TEOS oxide, or polysilicon of thickness 2,000-20,000 Å. (FIG. 13B)

5. Perform direct wafer bonding procedure. Use a handling substrate 1301, either p-type or n-type wafer, thickness of 200-925 μm. Bond the device wafer 1303 with the handling substrate 1301 and anneal under an appropriate well-known technique. (FIG. 13C)

6. Grind and polish from the back side of the device wafer to a remaining device layer 1303 of thickness of 3-100 μm. (FIG. 13D)

7. Follow the steps 5-20 in the fabrication procedure for device construction using the epitaxial technique.

Figure 10:
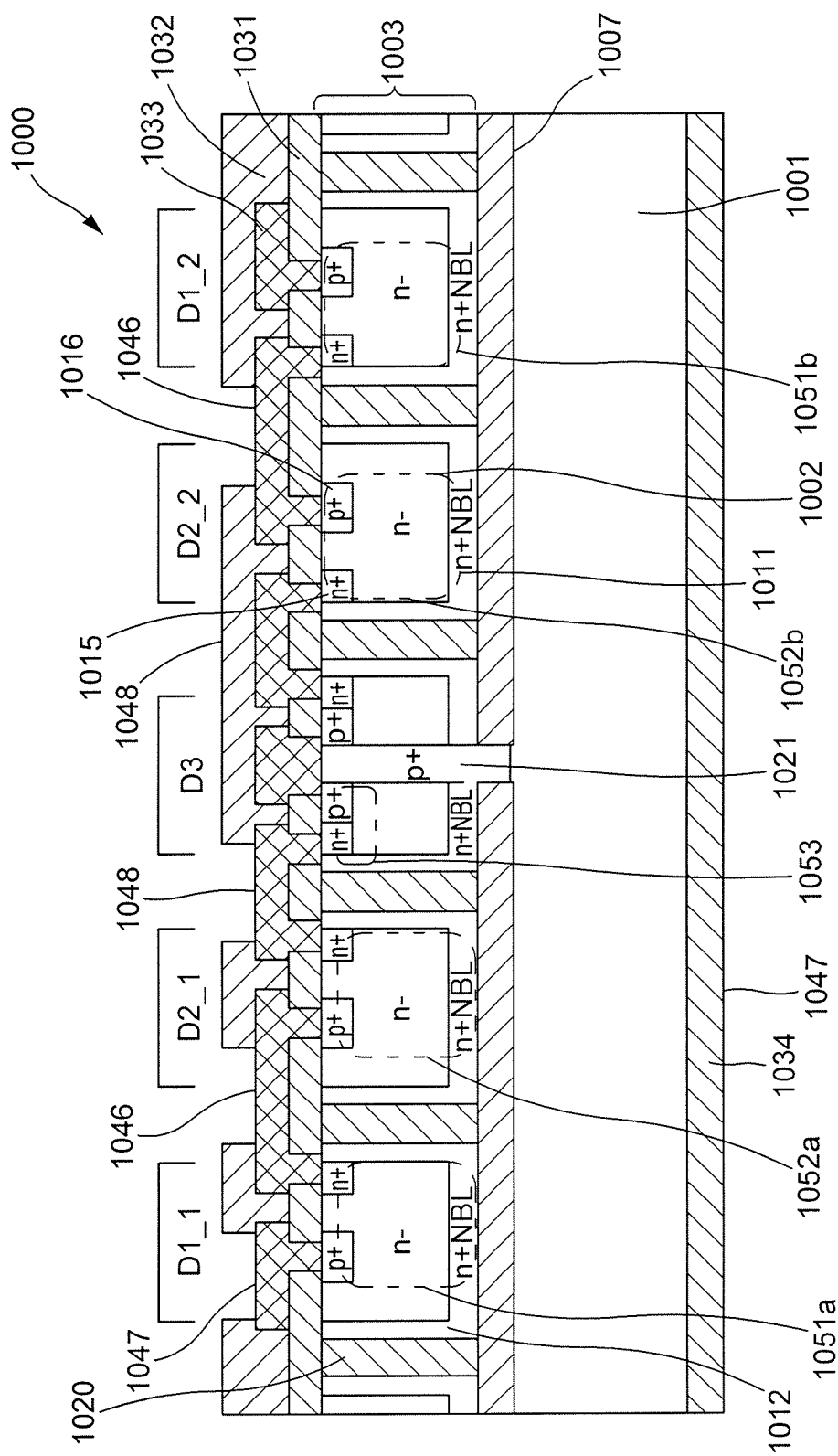
FIG. 10 is a cross-sectional view of yet another two-channel unidirectional assembled device array of the present invention.

Embodiment of FIG. 10

FIG. 10 is a cross-sectional view illustrating the semiconductor construction of a unidirectional assembled device array 1000 of the present invention. The device is fabricated in accordance with a preferred embodiment of the present invention. Equivalent circuit of the unidirectional assembled device array 1000 is the same as that shown in FIG. 3A.

The assembled device array 1000 comprises a p+ doped semiconductor substrate 1001. An intermediate layer 1007 is disposed between the device layer 1003 and the handling substrate 1001. An n+ buried layer (NBL) 1011 is formed above the intermediate layer 1007 and at the bottom surface of the device layer 1003. An n− device layer 1002 is disposed over NBL 1011 on device layer 1003. The device layer 1003, where device components D1 1051, D2 1052 and D3 1053 are fabricated, is attached to the substrate 1001 via wafer bonding technique. There are isolation trench regions 1020 formed around each diode component 1051-1053, to avoid interference among them. Each device component 10514053 is formed in an individual island 1022, surrounded by trench 1020 and separated by n+ NBL region 1011. A heavily doped n+ diffused region 1015 is disposed on the surface of the n− device layer 1002. This n+ diffused region 1015 serves to change the dopant concentration of n-type doped side of p-n junction of the device component D3 1053 in order to obtain appropriate breakdown voltage for the device component D3 1053. A p+ diffused region 1016 is formed on the device layer 1003, and forms the anode of device components D1-D3 1051-1053. In the island 1022 for the main semiconductor device component D3 1053, a second trench 1021 is disposed with trench bottom contacting the p-type substrate 1001 and p+ polysilicon is filled inside the second trench 1021.

Thus, the main semiconductor device component D3 1053 is constructed of a n+/p+/p+ polysilicon/p+ substrate structure, while device components, D2 1052 and D1 1051, are constructed of p+/n−/n+ structure, as shown in FIG. 10.

The p+ substrate 1001 constitutes the ground 1047 of this unidirectional device array 1000. The p+ diffused region 1016 and p+ polysilicon inside the second trench 1021, shorted to ground 1047, are electrically connected to the p+ diffused region 1016 of components D1 1051 via metal interconnection. The n+ diffused region 1015 of device component D3 1053 constitutes the Vcc electrode 1048, and is electrically connected to the n+ diffused region 1015 of device components D2 1052 via metal interconnection. The p+ diffused regions 1016 of diode components D2_1 1052a and D2_2 1052b are connected to the n+ diffused regions 1015 of diode components D1_1 1051a and D1_2 1051b via metal interconnection, separately, and forms an I/O electrode 1046. There are two I/O electrodes 1046 form on the front surface of the device layer 1003.

The one trench 1020 that surrounds the island 1022 serves as isolation purpose. The n+ side diffused region 1012 fabricated along the sidewalls of trench 1020 is intended to reduce the series resistance between n+NBL region 1011 and the cathode of device components D1 1051 and D2 1052. Its presence may not be necessary if the series resistance is not of concern. The trench 1020 can be filled with thermal oxide, plasma-enhanced oxide or nitride, TEOS (tetraethoxysilane) oxide, CVD (chemical vapor deposition) oxide and/or polysilicon.

Essentially, the entire semiconductor construction of the unidirectional assembled device array 1000 of FIG. 10, (namely two sets of unidirectional assembled device with equivalent circuit of FIG. 1B, depicted in the equivalent circuit of FIG. 3A as an entire device) is constructed inside the device layer 1003 atop the substrate 1001.

Preferably, this unidirectional assembled device 1000 is packaged as a flip chip or in an assembly requiring co-planar electrode pads, i.e., all electrode pads of the assembled device are on the same surface of the semiconductor construction.

In one preferred embodiment of the present invention, this semiconductor assembled device 1000 is fabricated using the substrate 1001 as a foundation to subsequently construct all the device components 1051-1053 atop in a sequence of fabrication procedural step described as below.

Using this wafer bonding technique, the doping concentration of the n− region 1002 in the structure can be very low, in the range of about 1E14 to 5E11 atoms/cm$^3$. This is possible by the use of a very high resistivity silicon wafer prepared using Czochralski (CZ) crystal growing technique, floating zone (FZ) crystal growing technique or neutron transmutation doping (NTD) technique. Thus, both $C_{D1}$ and $C_{D2}$ in the device capacitance equation (1) can be made even lower than those fabricated by epitaxial technology.

1. Starting with the device wafer 1003, n-type substrate, 3-10,000 ohm-cm, thickness of 200-925 μm.

2. On the polished side, top surface of the device wafer 1003, deposit n-type dopant material, e.g., Antimony or Arsenic, by solid or gas phase deposition, or implant n-type material using ion implantation.

3. The n-type dopant material on the top surface of the device wafer is driven into the silicon wafer to form an n+ buried layer (NBL) 1011.

4. Form an intermediate layer 1007 by growing a thermal oxide layer of 1,000-20,000 Å. Or grow a thin thermal oxide of 500-2,000 Å and then deposit plasma-enhanced oxide, TEOS oxide, or polysilicon of thickness 2,000-20,000 Å. These layers combine to form the intermediate layer 1007.

5. Perform direct wafer bonding procedure. Prepare a p+ doped handling substrate 1001, 0.001-0.02 ohm-cm, thickness of 200-925 μm. Bond the device wafer 1003 with the handling substrate 1001 and anneal under an appropriate well-known technique.

6. Grind and polish from the back side of the device wafer 1003 to a remaining device layer 1003 of thickness of 3-100 μm.

7. Grow an oxide layer, about 2,000-10,000 Å, on surface of the device layer 1003.

8. Define trench region 1020 by photolithography, etch oxide layer, and then etch the trench 1020 by high density plasma etcher from the top surface down through n+ NBL 1011 layer and reaching to the top of intermediate layer 1007.

9. Process the sidewalls of the trench 1020 by ion implantation or other techniques using phosphorus to form n+ side diffused region 1012.

10. Fill the trench 1020 by growing thermal oxide on the sidewalls of the trench 1020, and deposit plasma enhanced oxide or nitride, or TEOS oxide, or CVD oxide, and/or polysilicon.

11. Planarize the top surface by plasma etch back and/or polishing technique, e.g., chemical polishing or chemical-mechanical polishing (CMP) technique.

12. Grow an oxide layer, about 2,000-10,000 Å, on surface of the device layer 1003.

13. Define second trench region 1021 by photolithography, etch oxide layer, and then etch the second trench 1021 by high density plasma etcher from the top surface down through n+ NBL layer 1011 and the intermediate layer 1007, and reaching to the handling substrate 1001.

14. Fill the second trench 1021 by depositing p+ doped polysilicon.

15. Planarize the top surface by plasma etch back and/or polishing technique, e.g., chemical polishing or chemical-mechanical polishing (CMP) technique.

16. Follow the steps 10-20 in the fabrication procedure for device construction using the epitaxial technique in the Embodiment of FIG. 4.

17. Deposit backside metal, e.g., pure Au, Alloyed-Au, Cr—Ni—Ag, V—Ni—Au, Ti—Ni—Ag, or Ti—Ni—Au, of thickness 1-5 m.

Figure 11:
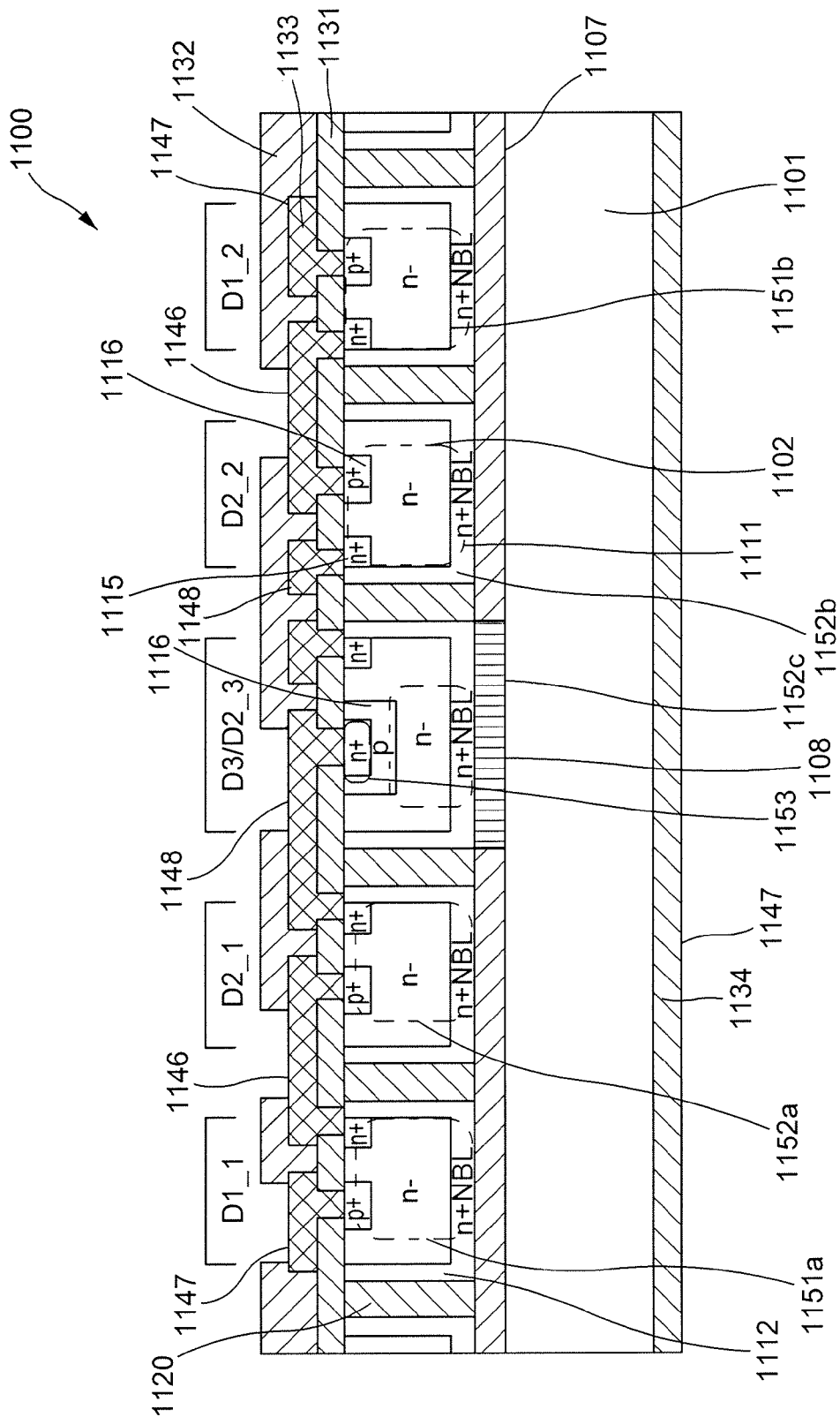
FIG. 11 is a cross-sectional view of yet another two-channel unidirectional assembled device array of the present invention.

Embodiment of FIG. 11

FIG. 11 is a cross-sectional view illustrating the semiconductor construction of a unidirectional assembled device array 1100 of the present invention. The device is fabricated in accordance with a preferred embodiment of the present invention. Equivalent circuit of the unidirectional assembled device array is the same as that shown in FIG. 3B.

This unidirectional assembled device array 1100 is equivalent to a bidirectionally assembled device when two I/O pins are assigned as the two electrodes in the bidirectional assembled device. The main semiconductor device component in this structure is then an open-base n-p-n bipolar transistor.

The assembled device array 1100 comprises an n+ doped semiconductor substrate 1101. An insulating intermediate layer 1 1107, under the area for making device components D1_1 1151a, D1_2 1151b, D2_1 1152a and D2_2 1152b, is disposed between the device layer 1103 and the handling substrate 1101. A conducting intermediate layer 2 1108, under the area for making device components D3 1153 and D2_3 1152c, is disposed between the device layer 1103 and the handling substrate 1101. An n+ buried layer (NBL) 1111 is formed above the intermediate layers 1107-1108 and at the bottom surface of the device layer 1103. An n-device layer 1102 is disposed over NBL 1111 on device layer 1103. The device layer 1103, where device components D1-D3 1151-1153 are fabricated, is attached to the substrate 1101 via wafer bonding technique. There are isolation trench regions 1120 formed around each diode component, to avoid interference among them. Each device component is formed in an individual island 1122, surrounded by trench 1120 and separated by n+ NBL region 1111. A p-type diffused region 1116 is disposed on the surface of the n− device layer 1103. A heavily doped n+ diffused region 1115 is formed inside one of the area of p-type diffused region 1116. In the island 1122 where the man device component D3 1153 is formed, the n+ diffused region 1115 acts as cathode of diode component D3 1153, and the p-type diffused region 1116 underneath the n+ diffused region 1115 acts as the anode of diode components D2_3 1152c and D3 1153. The p-type diffused region 1116 inside this island 1122 also serves as the base of an open base n-p-n bipolar transistor. The n+NBL region 1111 for the main device component contacts with the conducting intermediate layer 2 1108, and connects to the n+ handling substrate 1101. In other islands 1122 where device components D1 1151 and D2 1152 are formed, the p-type diffused region 1116 acts as the anode of the device components 1151-1153. The breakdown voltage of the assembled device 1100 is then the open-base emitter-to-collector breakdown voltage of the n-p-n transistor. The breakdown voltage can be adjusted by appropriately applying fabrication technique of the conventional bipolar transistor.

The main semiconductor device component D3 1153 and diode component D2_3 1152c are integrated as an open-base n-p-n bipolar transistor and constructed of a n+/p/n−/n+NBL/n+IML/n+ substrate structure, while device components D2 1152 and D1 1151 are constructed of a p+/n−/n+ structure as shown in FIG. 11.

The n+ substrate 1101 constitutes the ground 1147 of this unidirectional device array 1100. The area of n+ substrate 1101, where it contacts the conducting intermediate layer 2 1108, is then connects to the n+ collector of the n-p-n transistor. The n+ diffused region 1115 on the surface of the device layer 1103, which connects to the n+ collector of the n-p-n transistor, of diode component D2_3 1152c, which is now shorted to the ground 1147, is connected to the p+ diffused region 1116 of device components D1_1 1151a and D1_2 1151b via metal interconnection. The n+ diffused region 1115, i.e., the n+ emitter of the n-p-n transistor, of the device component D3 1153 constitutes the Vcc electrode 1148, and is electrically connected to the n+ diffused region 1115 of device components D2_1 1152a and D2_2 1152b via metal interconnection. The p+ diffused region 1116 of device components D2_1 1152a and D2_2 1152b are connected to the n+ diffused region 1115 of device components D1_1 1151a and D1_2 1151b via metal interconnection, separately, and forms an I/O electrode 1146. There are two I/O electrodes 1146 form on the front surface of the device layer 1103.

The one trench 1120 that surrounds the island 1122 serves as isolation purpose. The n+ side diffused region 1112 fabricated along the sidewalls of trench 1120 is intended to reduce the series resistance between n+NBL region 1111 and the cathode of diode component D1 1151. Its presence may not be necessary if the series resistance is not of concern. The trench 1120 can be filled with thermal oxide, plasma-enhanced oxide or nitride, TEOS (tetraethoxysilane) oxide, CVD (chemical vapor deposition) oxide and/or polysilicon.

Essentially, the entire semiconductor construction of the unidirectional assembled device array 1100 of FIG. 11, (namely two sets of unidirectional assembled device with equivalent circuit of FIG. 1C, depicted in the equivalent circuit of FIG. 3B as an entire device) is constructed inside the device layer 1103 atop the substrate 1101.

Preferably, this unidirectional assembled device 1100 is packaged as a flip chip or in an assembly requiring co-planar electrode pads, i.e., all electrode pads of the assembled device are on the same surface of the semiconductor construction.

In one preferred embodiment of the present invention, this semiconductor assembled device is fabricated using the substrate as a foundation to subsequently construct all the device components atop in a sequence of fabrication procedural step described as below.

Using this wafer bonding technique, the doping concentration of the n− region 1102 in the structure can be very low, in the range of about 1E14 to 5E11 atoms/cm$^3$. This is possible by the use of a very high resistivity silicon wafer prepared using Czochralski (CZ) crystal growing technique, floating zone (FZ) crystal growing technique or neutron transmutation doping (NTD) technique. Thus, both $C_{D1}$ and $C_{D2}$ in the device capacitance equation (1) can be made even lower than those fabricated by epitaxial technology.

1. Starting with the device wafer 1103, n-type substrate, 3-10,000 ohm-cm, thickness of 200-925 μm.

2. Grow an oxide layer, about 1,000-10,000 Å, on surface of the device layer 1103.

3. Define trench region 1120 by photolithography, etch oxide layer, and then etch the trench 1120 by high density plasma etcher from the top surface to a depth of from 3 to 100 µm.

4. Process the sidewalls of the trench 1120 by ion implantation or other techniques using phosphorus to form n+ side diffused regions 1112.

5. Fill the trench 1120 by growing thermal oxide on the sidewalls of the trench 1120, and deposit plasma enhanced oxide or nitride, or TEOS oxide, or CVD oxide, and/or polysilicon.

6. Planarize the top surface by plasma etch back and/or polishing technique, e.g., chemical polishing or chemical-mechanical polishing (CMP) technique.

7. On the polished side, top surface of the device wafer 1103, deposit n-type dopant material, e.g., Antimony or Arsenic, by solid or gas phase deposition, or implant n-type material using ion implantation.

8. The n-type dopant material on the top surface of the device wafer 1103 is driven into the silicon wafer to form an n+ buried layer (NBL) 1111.

9. Form an intermediate layer 1 1107 by growing a thermal oxide layer of 1,000-20,000 Å. Or grow a thin thermal oxide of 500-2,000 Å and then deposit plasma-enhanced oxide, or TEOS oxide of thickness 2,000-20,000 Å. These layers combine to form the intermediate layer 1 1107.

10. Define an area for the intermediate layer 2 1108 by photolithography, etch oxide layer, and then deposit n+ doped polysilicon of thickness of 5,000-30,000 Å.

11. Planarize the top surface by plasma etch back and/or polishing technique, e.g., chemical polishing or chemical-mechanical polishing (CMP) technique.

12. Perform direct wafer bonding procedure. Prepare a n+ doped handling substrate 1101, 0.001-0.020 ohm-cm, thickness of 200-925 µm. Bond the device wafer 1103 with the handling substrate 1101 and anneal under an appropriate well-known technique.

13. Grind and polish from the back side of the device wafer 1103 to a remaining device layer of thickness of 3-100 µm.

14. Grow an oxide layer, about 2,000-10,000 Å, on surface of the device layer.

15. Follow the steps 10-20 in the fabrication procedure for device construction using the epitaxial technique in the Embodiment of FIG. 4.

16. Deposit backside metal, e.g., pure Au, Alloyed-Au, Cr—Ni—Ag, V—Ni—Au, Ti—Ni—Ag, or Ti—Ni—Au, of thickness 1-5 m.

While the above is a full description of the specific embodiments, various modifications, alternative constructions and equivalents may be used. Therefore, the above description and illustrations should not be taken as limiting the scope of the present invention.

The invention claimed is:

1. A process for fabricating a semiconductor device having reduced capacitance for high frequency circuit protection comprising:

depositing n-type dopant material by solid or gas phase deposition, or implant n-type material using ion implantation to a polished side, top surface of a device wafer that serves as an n-type substrate;

forming an n+ buried layer by driving the n-type dopant material into the device wafer;

forming an intermediate layer by growing a thermal oxide layer and/or then depositing plasma-enhanced oxide, TEOS oxide, or polysilicon;

performing a direct wafer bonding procedure using a handling substrate of either p-type or n-type wafer by bonding the device wafer with the handling substrate and then annealing;

then grinding and polishing from the back side of the device wafer up to a remaining device layer forming trenches that surround the device region with depth extending from the top surface, going through the n+ buried layer and reaching down to the intermediate layer and then forming an n+ layer on the sidewalls of the trenches by solid or gas phase deposition or ion implantation;

filling the trenches by growing a layer of thermal oxide on the sidewalls of the trenches and followed by deposition of plasma enhanced oxide, nitride, TEOS oxide, CVD oxide, or polysilicon into the trenches and then planarizing the top surface by plasma etch back or polishing;

forming n+ region of the device by forming an oxide layer on the top surface of the device layer and then etching the oxide by photolithography, then depositing n-type dopant material by solid or gas phase deposition or ion implantation and then driving in by high temperature diffusion;

forming p+ region of the device by etching the oxide using photolithography, then depositing p-type dopant material by solid or gas phase deposition or ion implantation and then driving in by high temperature diffusion so that the breakdown voltage between cathode and anode of the device is set to a targeted voltage for high frequency circuit protection.

2. The process of claim 1 wherein the device wafer is 3-10,000 ohm-cm and has a thickness of 200-925 µm.

3. The process of claim 1 wherein the thermal oxide layer of the intermediate layer is a thermal oxide layer of 1,000-20,000 Å thick.

4. The process of claim 1 wherein the handling substrate of either p-type or n-type wafer has a thickness of 200-925 µm.

5. The process of claim 1 wherein the remaining device layer after grinding and polishing from the back side of the device wafer has a thickness of 3-100 µm.

6. A process for fabricating a semiconductor device having reduced capacitance for high frequency circuit protection comprising:

forming an oxide on a surface of the device wafer of n-type doped substrate;

forming an n+ buried layer by driving the n-type dopant material into the polished side, top surface of device wafer and driving in by high temperature diffusion;

forming an intermediate layer by growing a thermal oxide layer or by growing a thin thermal oxide layer and then depositing plasma-enhanced oxide, TEOS oxide and/or polysilicon;

performing a direct wafer bonding procedure using a handling substrate of a p+ doped wafer by bonding the device wafer with the handling substrate and then annealing;

then grinding and polishing from the back side of the device wafer up to a remaining device layer;

forming first trenches that surround the device region with depth extending to the intermediate layer;

forming an n+ layer on the sidewalls of the first trenches by solid or gas phase deposition or ion implantation;

filling the trenches by growing a layer of thermal oxide on the sidewalls of the trenches and followed by deposition of plasma enhanced oxide, nitride, TEOS oxide, CVD oxide, or polysilicon into the trenches and then planarizing the top surface by plasma etch back or polishing;

growing an oxide layer and then forming second trenches inside the device region with depth extending from the top surface down through the intermediate layer and to the handling substrate;

filling the second trenches by depositing a p+ doped polysilicon into the trenches and then planarizing the top surface by plasma etch back or polishing;

forming n+ region of the device by forming an oxide layer on the top surface of the device layer and then etching the oxide by photolithography, then depositing n-type dopant material by solid or gas phase deposition or ion implantation and then driving in by high temperature diffusion;

forming p+ region of the device by etching the oxide using photolithography, then depositing p-type dopant material by solid or gas phase deposition or ion implantation and then driving in by high temperature diffusion so that the breakdown voltage between cathode and anode of the device is set to a targeted voltage for high frequency circuit protection.

7. The process of claim 6 wherein the device wafer is 3-10,000 ohm-cm and has a thickness of 200-925 μm.

8. The process of claim 6 wherein the thermal oxide layer of the intermediate layer is a thermal oxide layer of 1,000-20,000 Å thick.

9. The process of claim 6 wherein the thin thermal oxide layer of the intermediate layer is a thermal oxide layer of 500-2,000 Å thick and the deposited oxide or polysilicon layer of 2,000-20,000 Å.

10. The process of claim 6 wherein the handling substrate of p+ doped wafer has a thickness of 200-925 μm.

11. The process of claim 6 wherein the remaining device layer after grinding and polishing from the back side of the device wafer has a thickness of 3-100 μm.

12. A process for fabricating a semiconductor device having reduced capacitance for high frequency circuit protection comprising:

forming an oxide on the surface of the device wafer of n-type doped substrate;

forming trenches that surround the device region with depth extending from the top surface;

forming an n+ layer on the sidewalls of the trenches by solid or gas phase deposition or ion implantation;

filling the trenches by growing a layer of thermal oxide on the sidewalls of the trenches and followed by deposition of plasma enhanced oxide, nitride, TEOS oxide, CVD oxide, or polysilicon into the trenches and then planarizing the top surface by plasma etch back or polishing;

forming an n+ buried layer by driving the n-type dopant material into the polished side, top surface of device wafer and driving in by high temperature diffusion;

forming the first intermediate layer by growing a thermal oxide layer or by growing a thin thermal oxide layer and then depositing plasma-enhanced oxide, TEOS oxide;

forming another intermediate layer by photolithography, etching oxide layer of the first intermediate layer, depositing an n+ doped polysilicon, and then planarizing the top surface by plasma etch back and/or polishing;

performing a direct wafer bonding procedure using a handling substrate of an n+ doped wafer by bonding the device wafer with the handling substrate and then annealing; then grinding and polishing from the back side of the device wafer up to a remaining device layer;

forming n+ region of the device by forming an oxide layer on the top surface of the device layer and then etching the oxide by photolithography, then depositing n-type dopant material by solid or gas phase deposition or ion implantation and then driving in by high temperature diffusion;

forming p+ region of the device by etching the oxide using photolithography, then depositing p-type dopant material by solid or gas phase deposition or ion implantation and then driving in by high temperature diffusion so that the breakdown voltage between cathode and anode of the device is set to a targeted voltage for high frequency circuit protection.

13. The process of claim 12 wherein the device wafer is 3-10,000 ohm-cm and has a thickness of 200-925 μm.

14. The process of claim 12 wherein the thermal oxide layer of the first intermediate layer is a thermal oxide layer of 1,000-20,000 Å thick.

15. The process of claim 12 wherein the thin thermal oxide layer of the first intermediate layer is a thermal oxide layer of 500-2,000 Å thick and the deposited oxide layer of 2,000-20,000 Å.

16. The process of claim 12 wherein the n+ doped polysilicon of 5,000-30,000 Å thick.

17. The process of claim 12 wherein the handling substrate of n+ doped wafer has a thickness of 200-925 μm.

18. The process of claim 12 wherein the remaining device layer after grinding and polishing from the back side of the device wafer has a thickness of 3-100 μm.

* * * * *